United States Patent [19]
Guttag et al.

[11] 4,450,519
[45] May 22, 1984

[54] PSUEDO-MICROPROGRAMMING IN MICROPROCESSOR IN SINGLE-CHIP MICROPROCESSOR WITH ALTERNATE IR LOADING FROM INTERNAL OR EXTERNAL PROGRAM MEMORIES

[75] Inventors: Karl M. Guttag, Houston; Gerald E. Laws, Austin, both of Tex.

[73] Assignee: Texas Instruments Incorporated, Dallas, Tex.

[21] Appl. No.: 210,106

[22] Filed: Nov. 24, 1980

[51] Int. Cl.³ .................. G06F 9/00; G06F 13/00; G06F 9/44
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 4,004,281 | 1/1977 | Bennett et al. | 364/200 |
| 4,153,933 | 5/1979 | Blume, Jr. et al. | 364/200 |
| 4,181,938 | 1/1980 | Suzuki et al. | 364/200 |
| 4,222,103 | 9/1980 | Chamberlain | 364/200 |
| 4,368,515 | 1/1983 | Nielsen | 364/200 |
| 4,371,931 | 2/1983 | Catiller et al. | 364/200 |

Primary Examiner—James D. Thomas
Assistant Examiner—Archie E. Williams
Attorney, Agent, or Firm—John G. Graham

[57] ABSTRACT

A single-chip microprocessor device of the MOS/LSI type contains an ALU, several internal busses, a number of address/data registers, and an instruction register (IR) with associated control decode or microcontrol generator circuitry. The device communicates with external memory and peripherals by a bidirectional multiplexed address/data bus and a number of control lines. In addition to the main off-chip memory, a smaller on-chip memory (including both ROM and RAM) is provided which allows execution of instruction sequences to emulate complex instructions or interpretors (macro-instructions). The macro-instructions are indistinguishable from "native" instructions since all memory fetches and the like are generated exactly the same way, and long instruction sequences are interruptable. This on-chip memory does not affect the off-chip main memory map. Microprocessors are thus made more versatile and can be customized with little design effort.

16 Claims, 9 Drawing Figures

Fig. 2c (con't.-2)

| | INSTR. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| GROUP G6 | MPYS | 0 | 0 | 0 | 0 | 0 | 0 | 0 | 1 | 1 | 1 | X | X | X | X | X | X |
| | DIVS | 0 | 0 | 0 | 0 | 0 | 0 | 0 | 1 | 1 | 0 | | | | | | |
| | BIND | 0 | 0 | 0 | 0 | 0 | 0 | 0 | 1 | 0 | 1 | | | | | | |
| | EVAD | 0 | 0 | 0 | 0 | 0 | 0 | 0 | 1 | 0 | 0 | | | | | | |
| GROUP G7 | ILLEGAL | 0 | 0 | 0 | 0 | 0 | 0 | 0 | 0 | 1 | 1 | X | X | X | X | X | X |
| | BLSK | 0 | 0 | 0 | 0 | 0 | 0 | 0 | 0 | 1 | 0 | 1 | 1 | | | | |
| | ILLEGAL | 0 | 0 | 0 | 0 | 0 | 0 | 0 | 0 | 1 | 0 | 1 | 0 | X | X | X | X |
| | LWP | 0 | 0 | 0 | 0 | 0 | 0 | 0 | 0 | 1 | 0 | 0 | 1 | | | | |
| | LST | 0 | 0 | 0 | 0 | 0 | 0 | 0 | 0 | 1 | 0 | 0 | 0 | | | | |
| G8 | ILLEGAL | 0 | 0 | 0 | 0 | 0 | 0 | 0 | 0 | 0 | 1 | X | X | X | X | X | X |
| GROUP G9 | ILLEGAL | 0 | 0 | 0 | 0 | 0 | 0 | 0 | 0 | 0 | 0 | 1 | 1 | X | X | X | X |
| | ILLEGAL | 0 | 0 | 0 | 0 | 0 | 0 | 0 | 0 | 0 | 0 | 1 | 0 | 1 | 1 | X | X |
| | ILLEGAL | 0 | 0 | 0 | 0 | 0 | 0 | 0 | 0 | 0 | 0 | 1 | 0 | 1 | 0 | 1 | 1 |
| | AM | 0 | 0 | 0 | 0 | 0 | 0 | 0 | 0 | 0 | 0 | 1 | 0 | 1 | 0 | 1 | 0 |
| | SM | 0 | 0 | 0 | 0 | 0 | 0 | 0 | 0 | 0 | 0 | 1 | 0 | 1 | 0 | 0 | 1 |
| | ILLEGAL | 0 | 0 | 0 | 0 | 0 | 0 | 0 | 0 | 0 | 0 | 1 | 0 | 1 | 0 | 0 | 0 |
| | ILLEGAL | 0 | 0 | 0 | 0 | 0 | 0 | 0 | 0 | 0 | 0 | 1 | 0 | 0 | X | X | X |
| | ILLEGAL | 0 | 0 | 0 | 0 | 0 | 0 | 0 | 0 | 0 | 0 | 0 | 1 | 1 | 1 | 1 | 1 |
| GROUP G10 | ILLEGAL | 0 | 0 | 0 | 0 | 0 | 0 | 0 | 0 | 0 | 0 | 0 | 1 | 1 | 1 | 1 | 0 |
| | SLAM | 0 | 0 | 0 | 0 | 0 | 0 | 0 | 0 | 0 | 0 | 0 | 1 | 1 | 1 | 0 | 1 |
| | SRAM | 0 | 0 | 0 | 0 | 0 | 0 | 0 | 0 | 0 | 0 | 0 | 1 | 1 | 1 | 0 | 0 |
| | ILLEGAL | 0 | 0 | 0 | 0 | 0 | 0 | 0 | 0 | 0 | 0 | 0 | 1 | 1 | 0 | X | X |
| | ILLEGAL | 0 | 0 | 0 | 0 | 0 | 0 | 0 | 0 | 0 | 0 | 0 | 1 | 0 | X | X | X |
| | ILLEGAL | 0 | 0 | 0 | 0 | 0 | 0 | 0 | 0 | 0 | 0 | 0 | 0 | X | X | X | X |
| | | 0 | 1 | 2 | 3 | 4 | 5 | 6 | 7 | 8 | 9 | 10 | 11 | 12 | 13 | 14 | 15 |

Fig. 2c

| INSTR. | OPCODE 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SOCB | 1 | 1 | 1 | 1 | X | X | X | X | X | X | X | X | X | X | X | X |
| SOC  | 1 | 1 | 1 | 0 | X | X | X | X | X | X | X | X | X | X | X | X |
| MOVB | 1 | 1 | 0 | 1 | | | | | | | | | | | | |
| MOV  | 1 | 1 | 0 | 0 | | | | | | | | | | | | |
| AB   | 1 | 0 | 1 | 1 | | | | | | | | | | | | |
| A    | 1 | 0 | 1 | 0 | ← FIELD | | | | | | | | | | | |
| CB   | 1 | 0 | 0 | 1 | | | | | | | | | | | | |
| C    | 1 | 0 | 0 | 0 | | | | | | | | | | | | |
| SB   | 0 | 1 | 1 | 1 | | | | | | | | | | | | |
| S    | 0 | 1 | 1 | 0 | | | | | | | | | | | | |
| SZCB | 0 | 1 | 0 | 1 | | | | | | | | | | | | |
| SZC  | 0 | 1 | 0 | 0 | | | | | | | | | | | | |
| DIV  | 0 | 0 | 1 | 1 | 1 | 1 | | | | | | | | | | |
| MPY  | 0 | 0 | 1 | 1 | 1 | 0 | | | | | | | | | | |
| STCR | 0 | 0 | 1 | 1 | 0 | 1 | ← FIELD | | | | | | | | | |
| LDCR | 0 | 0 | 1 | 1 | 0 | 0 | | | | | | | | | | |
| XOP  | 0 | 0 | 1 | 0 | 1 | 1 | | | | | | | | | | |
| XOR  | 0 | 0 | 1 | 0 | 1 | 0 | | | | | | | | | | |
| CZC  | 0 | 0 | 1 | 0 | 0 | 1 | | | | | | | | | | |
| COC  | 0 | 0 | 1 | 0 | 0 | 0 | | | | | | | | | | |
| TB   | 0 | 0 | 0 | 1 | 1 | 1 | 1 | 1 | | | | | | | | |
| SBZ  | 0 | 0 | 0 | 1 | 1 | 1 | 1 | 0 | | | | | | | | |
| SBO  | 0 | 0 | 0 | 1 | 1 | 1 | 0 | 1 | | | | | | | | |
| JOP  | 0 | 0 | 0 | 1 | 1 | 1 | 0 | 0 | | | | | | | | |
| JH   | 0 | 0 | 0 | 1 | 1 | 0 | 1 | 1 | | | | | | | | |
| JL   | 0 | 0 | 0 | 1 | 1 | 0 | 1 | 0 | | | | | | | | |
| JNO  | 0 | 0 | 0 | 1 | 1 | 0 | 0 | 1 | | | | | | | | |
| JOO  | 0 | 0 | 0 | 1 | 1 | 0 | 0 | 0 | ← FIELD | | | | | | | |
| JNC  | 0 | 0 | 0 | 1 | 0 | 1 | 1 | 1 | | | | | | | | |
| JNE  | 0 | 0 | 0 | 1 | 0 | 1 | 1 | 0 | | | | | | | | |
| JGT  | 0 | 0 | 0 | 1 | 0 | 1 | 0 | 1 | | | | | | | | |
| JHB  | 0 | 0 | 0 | 1 | 0 | 1 | 0 | 0 | | | | | | | | |
| JEQ  | 0 | 0 | 0 | 1 | 0 | 0 | 1 | 1 | | | | | | | | |
| JLL  | 0 | 0 | 0 | 1 | 0 | 0 | 1 | 0 | | | | | | | | |
| JLT  | 0 | 0 | 0 | 1 | 0 | 0 | 0 | 1 | | | | | | | | |
| JMP  | 0 | 0 | 0 | 1 | 0 | 0 | 0 | 0 | ← FIELD | | | | | | | |
| ILLEGAL | 0 | 0 | 0 | 0 | 1 | 1 | 1 | X | X | X | X | X | X | X | X | X |
| ILLEGAL | 0 | 0 | 0 | 0 | 1 | 1 | 0 | 1 | X | X | X | X | X | X | X | X |
| ILLEGAL | 0 | 0 | 0 | 0 | 1 | 1 | 0 | 0 | 1 | X | X | X | X | X | X | X |
| ILLEGAL | 0 | 0 | 0 | 0 | 1 | 1 | 0 | 0 | 0 | 1 | X | X | X | X | X | X |
| ILLEGAL | 0 | 0 | 0 | 0 | 1 | 1 | 0 | 0 | 0 | 0 | 1 | X | X | X | X | X |
| ILLEGAL | 0 | 0 | 0 | 0 | 1 | 1 | 0 | 0 | 0 | 0 | 0 | 1 | X | X | X | X |
| ILLEGAL | 0 | 0 | 0 | 0 | 1 | 1 | 0 | 0 | 0 | 0 | 0 | 0 | 1 | X | X | X |
|  | 0 | 1 | 2 | 3 | 4 | 5 | 6 | 7 | 8 | 9 | 10 | 11 | 12 | 13 | 14 | 15 |

Groups: G0 (SOCB–SZC), G1 (DIV–COC), G2 (TB–JMP)

TD = TYPE OF DESTINATION ADDRESSING
D = DESTINATION ADDRESS BITS
TS = TYPE OF SOURCE ADDRESSING
S = SOURCE ADDRESS BITS

Fig. 2c (con't. -1)

| Group | INSTR. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| GROUP G3 | TSMB | 0 | 0 | 0 | 0 | 1 | 1 | | | ←FIELD→ | | | 1 | 0 | 1 | 1 |
| | TCMB | 0 | 0 | 0 | 0 | 1 | 1 | | | | | | 1 | 0 | 1 | 0 |
| | TMB  | 0 | 0 | 0 | 0 | 1 | 1 | | | | | | 1 | 0 | 0 | 1 |
| | ILLEGAL | 0 | 0 | 0 | 0 | 1 | 1 | | | | | | 1 | 0 | 0 | 0 |
| | ILLEGAL | 0 | 0 | 0 | 0 | 1 | 1 | | | | | 0 | X | X | X | X |
| | SRC  | 0 | 0 | 0 | 0 | 1 | 0 | 1 | 1 | X | X | X | X | X | X | X | X |
| | SLA  | 0 | 0 | 0 | 0 | 1 | 0 | 1 | 0 | X | X | X | X | X | X | X | X |
| | SL   | 0 | 0 | 0 | 0 | 1 | 0 | 0 | 1 | X | X | X | X | X | X | X | X |
| | SRA  | 0 | 0 | 0 | 0 | 1 | 0 | 0 | 0 | X | X | X | X | X | X | X | X |
| GROUP G4 | LDD  | 0 | 0 | 0 | 0 | 0 | 1 | 1 | 1 | 1 | 1 | X | X | X | X | X | X |
| | LDS  | 0 | 0 | 0 | 0 | 0 | 1 | 1 | 1 | 1 | 0 | X | X | X | X | X | X |
| | ABS  | 0 | 0 | 0 | 0 | 0 | 1 | 1 | 1 | 0 | 1 | X | | | | | |
| | SETO | 0 | 0 | 0 | 0 | 0 | 1 | 1 | 1 | 0 | 0 | X | | | | | |
| | SWPB | 0 | 0 | 0 | 0 | 0 | 1 | 1 | 0 | 1 | 1 | X | | | | | |
| | BL   | 0 | 0 | 0 | 0 | 0 | 1 | 1 | 0 | 1 | 0 | X | ←FIELD→ | | | | |
| | DECT | 0 | 0 | 0 | 0 | 0 | 1 | 1 | 0 | 0 | 1 | X | | | | | |
| | DEC  | 0 | 0 | 0 | 0 | 0 | 1 | 1 | 0 | 0 | 0 | X | | | | | |
| | INCT | 0 | 0 | 0 | 0 | 0 | 1 | 0 | 1 | 1 | 1 | X | | | | | |
| | INC  | 0 | 0 | 0 | 0 | 0 | 1 | 0 | 1 | 1 | 0 | X | | | | | |
| | INV  | 0 | 0 | 0 | 0 | 0 | 1 | 0 | 1 | 0 | 1 | X | | | | | |
| | NEG  | 0 | 0 | 0 | 0 | 0 | 1 | 0 | 1 | 0 | 0 | X | | | | | |
| | CLR  | 0 | 0 | 0 | 0 | 0 | 1 | 0 | 0 | 1 | 1 | X | | | | | |
| | X    | 0 | 0 | 0 | 0 | 0 | 1 | 0 | 0 | 1 | 0 | X | | | | | |
| | B    | 0 | 0 | 0 | 0 | 0 | 1 | 0 | 0 | 0 | 1 | X | | | | | |
| | BLWP | 0 | 0 | 0 | 0 | 0 | 1 | 0 | 0 | 0 | 0 | X | | | | | |
| GROUP G5 | LREX | 0 | 0 | 0 | 0 | 0 | 0 | 1 | 1 | 1 | 1 | 1 | | | | | |
| | CKOF | 0 | 0 | 0 | 0 | 0 | 0 | 1 | 1 | 1 | 1 | 0 | ←FIELD→ | | | | |
| | CKON | 0 | 0 | 0 | 0 | 0 | 0 | 1 | 1 | 1 | 0 | 1 | | | | | |
| | RTWP | 0 | 0 | 0 | 0 | 0 | 0 | 1 | 1 | 1 | 0 | 0 | | | | | |
| | RSET | 0 | 0 | 0 | 0 | 0 | 0 | 1 | 1 | 0 | 1 | 1 | | | | | |
| | IDLE | 0 | 0 | 0 | 0 | 0 | 0 | 1 | 1 | 0 | 1 | 0 | | | | | |
| |      | 0 | 0 | 0 | 0 | 0 | 0 | 1 | 1 | 0 | 0 | 1 | | | | | |
| | LIMI | 0 | 0 | 0 | 0 | 0 | 0 | 1 | 1 | 0 | 0 | 0 | | | | | |
| | LWPI | 0 | 0 | 0 | 0 | 0 | 0 | 1 | 0 | 1 | 1 | 1 | 0 | 0 | 0 | 0 | 0 |
| | STST | 0 | 0 | 0 | 0 | 0 | 0 | 1 | 0 | 1 | 1 | 0 | | | | | |
| | STWP | 0 | 0 | 0 | 0 | 0 | 0 | 1 | 0 | 1 | 0 | 1 | | | | | |
| | CI   | 0 | 0 | 0 | 0 | 0 | 0 | 1 | 0 | 1 | 0 | 0 | | | | | |
| | CRI  | 0 | 0 | 0 | 0 | 0 | 0 | 1 | 0 | 0 | 1 | 1 | | | | | |
| | ANDI | 0 | 0 | 0 | 0 | 0 | 0 | 1 | 0 | 0 | 1 | 0 | | | | | |
| | AI   | 0 | 0 | 0 | 0 | 0 | 0 | 1 | 0 | 0 | 0 | 1 | | | | | |
| | LI   | 0 | 0 | 0 | 0 | 0 | 0 | 1 | 0 | 0 | 0 | 0 | | | | | |

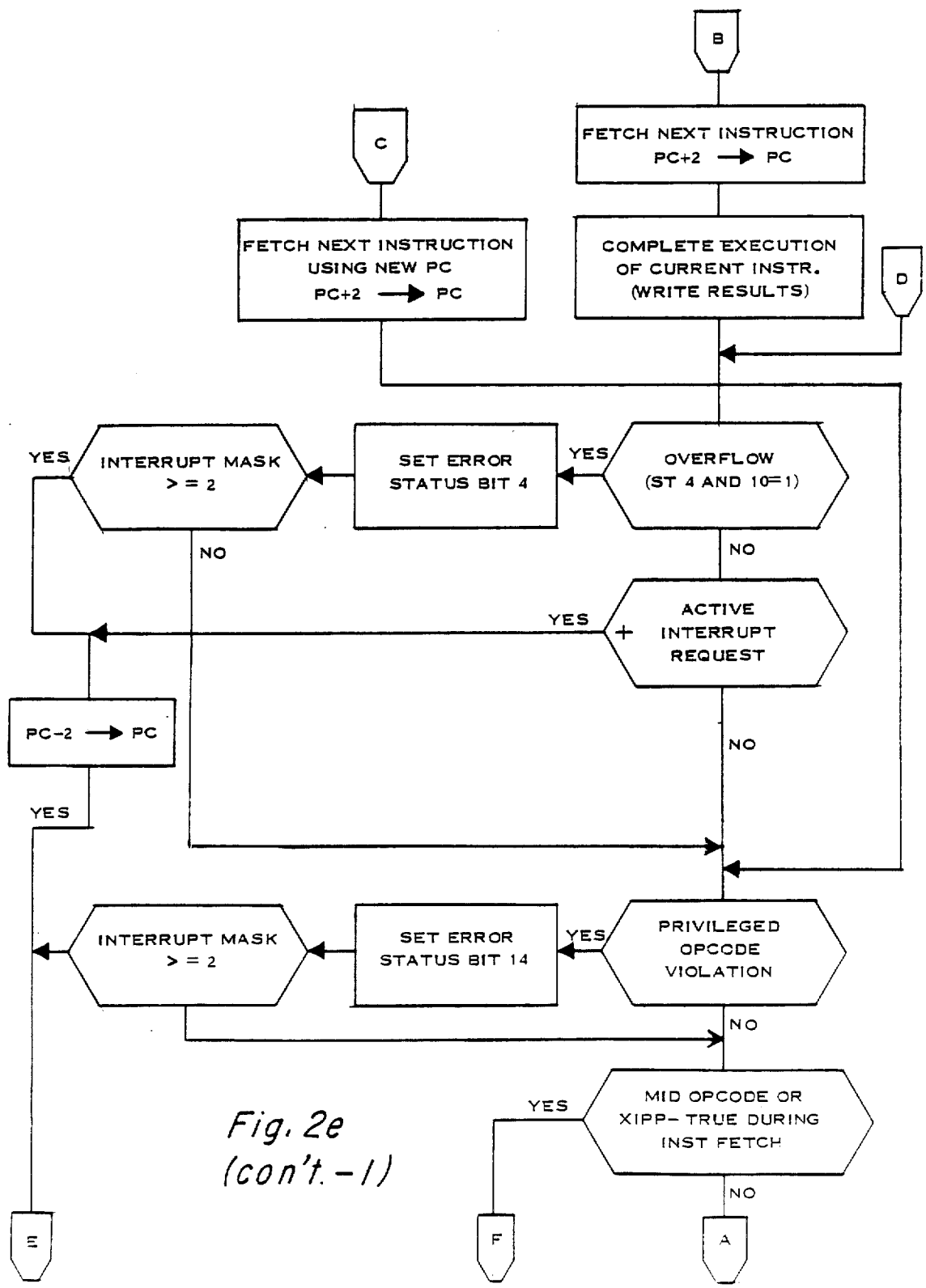
Fig. 2e (con't.-1)

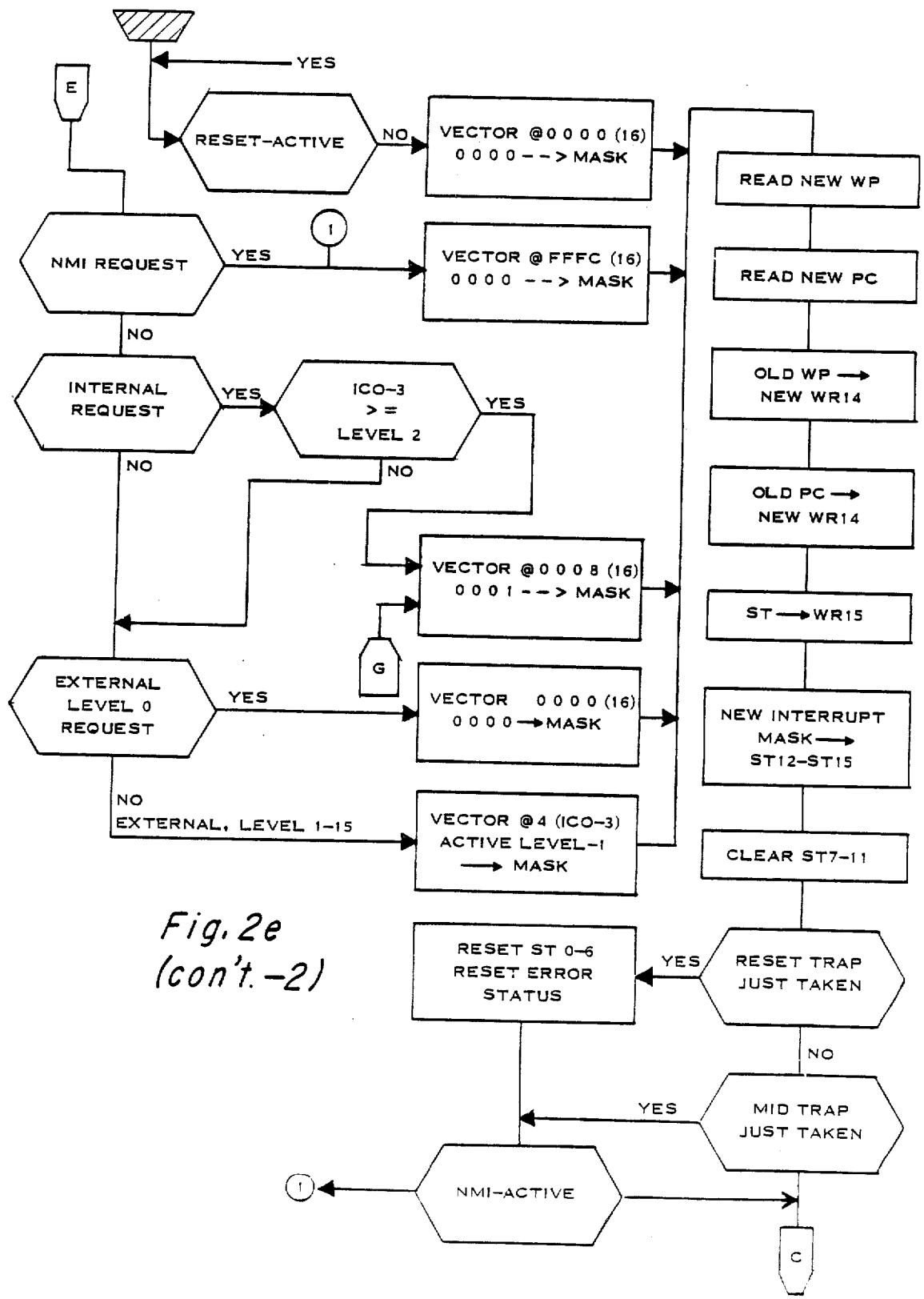
Fig. 2e (con't.-2)

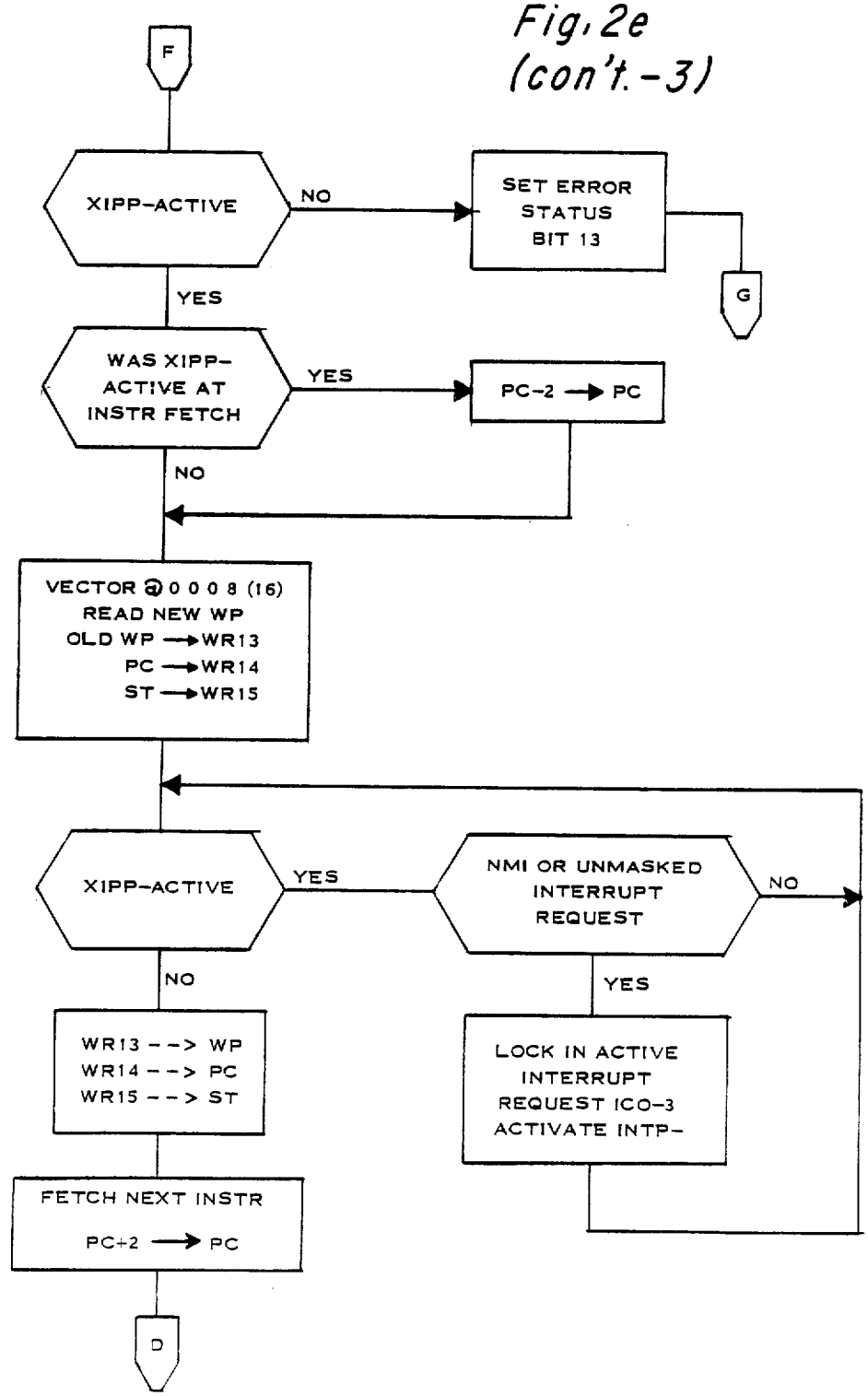
Fig. 2e (con't.-3)

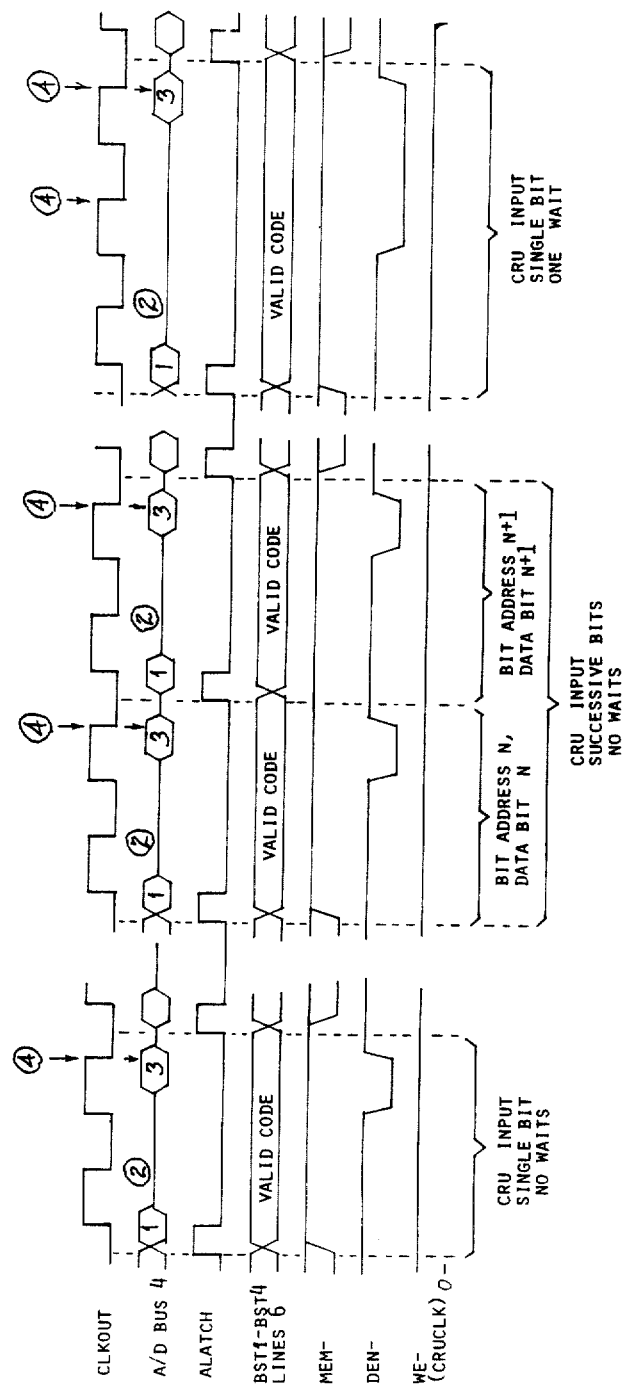
Fig. 2f  CRU TIMING - INPUT OPERATION

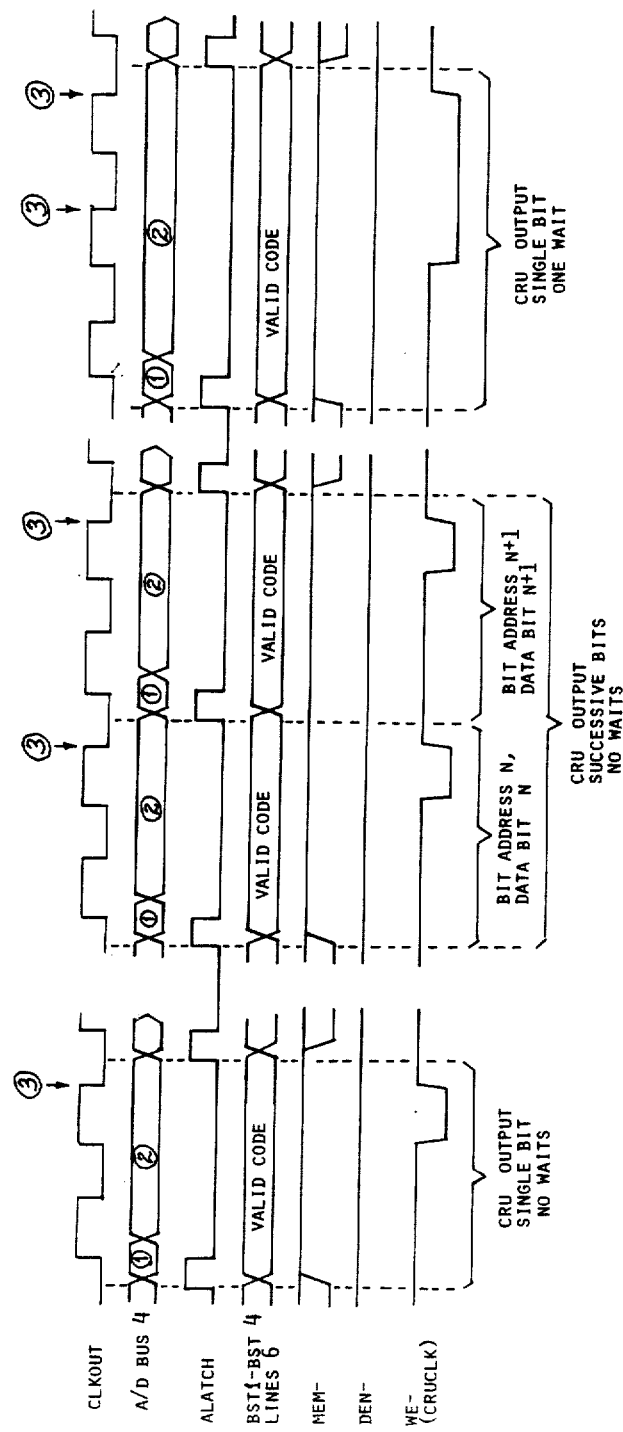

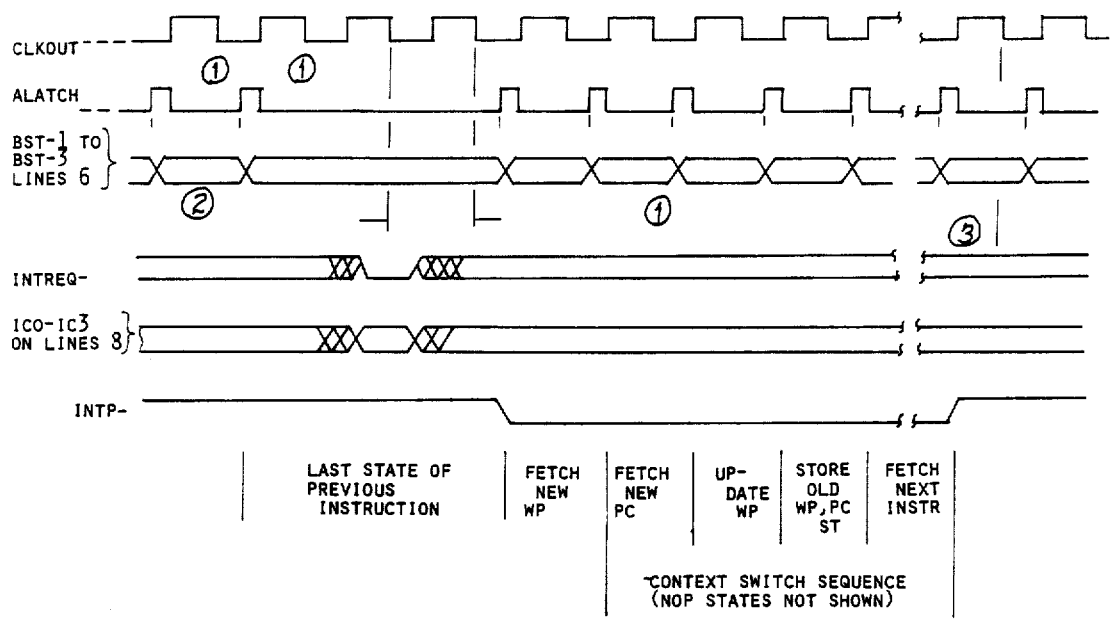

NOTES:
(1) INTREQ- AND IC (0-3) ARE FIRST SAMPLED IN THE IAQ STATE. IF THE WAIT STATES OCCUR IN THE FOLLOWING STATE, SAMPLES WILL CONTINUE TO BE TAKEN UNTIL ONE CLOCK BEFORE THE END OF THAT STATE.
(2) THE PREFETCHED INSTRUCTION WILL BE DISCARDED.
(3) INTREQ- WILL NOT BE SAMPLED DURING THE FIRST INSTRUCTION FETCH AFTER THE CONTEXT SWITCH SEQUENCE.

*Fig. 2j*

INTERRUPT SEQUENCE

FOR NMI, SEQUENCE IS SAME AS ABOVE EXCEPT NMI- IS SAMPLED AT SAME TIMING AS INTREQ-, AND IC-0 TO IC-3 LINES 8 STAY AT "DON'T CARE".

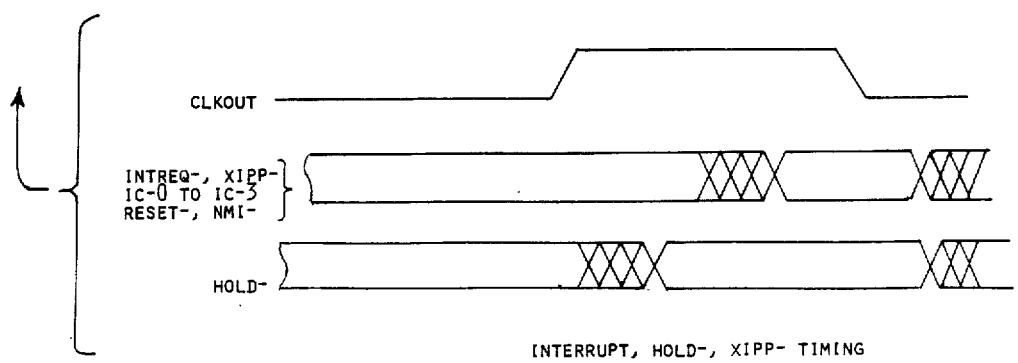

INTERRUPT, HOLD-, XIPP- TIMING

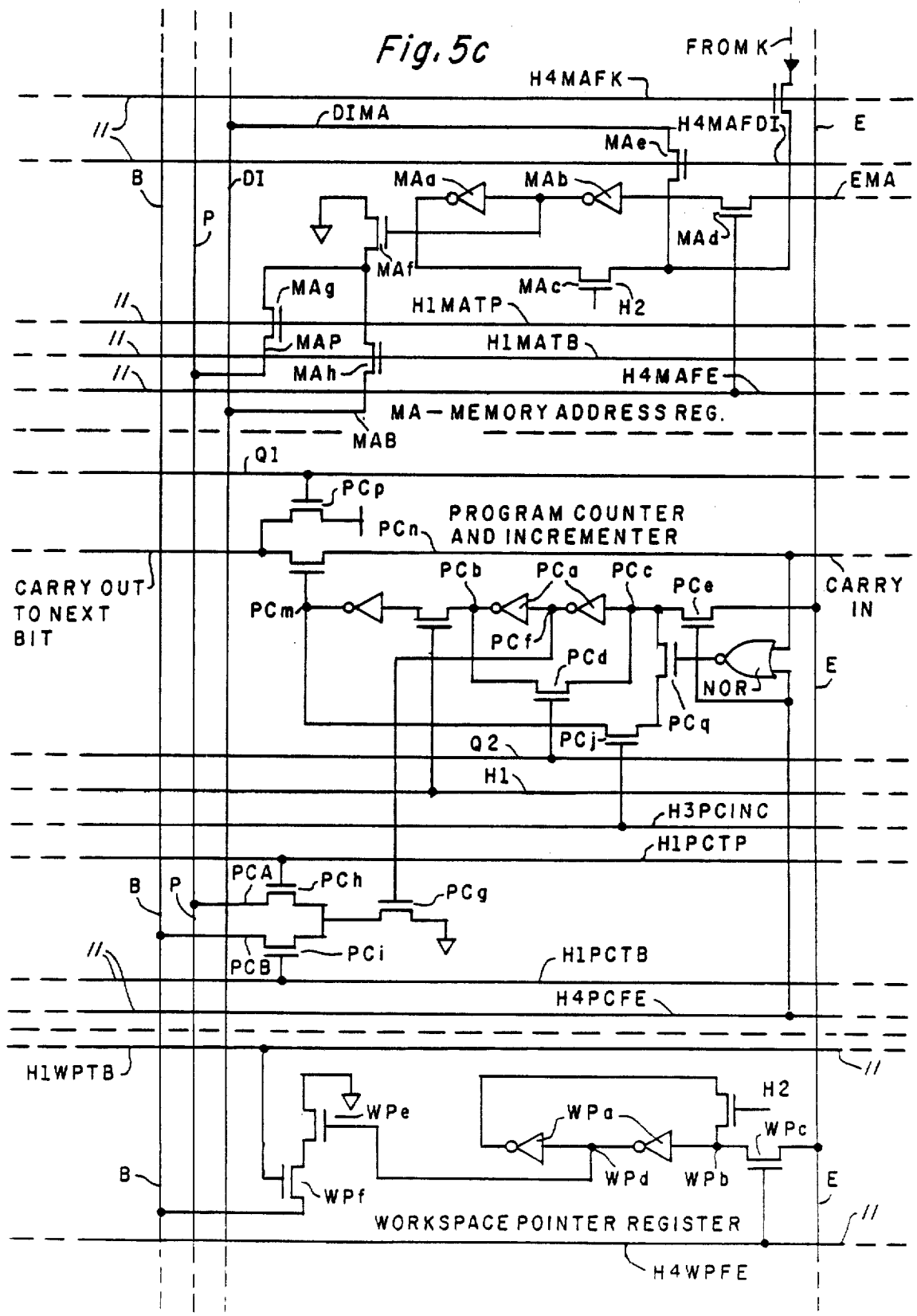

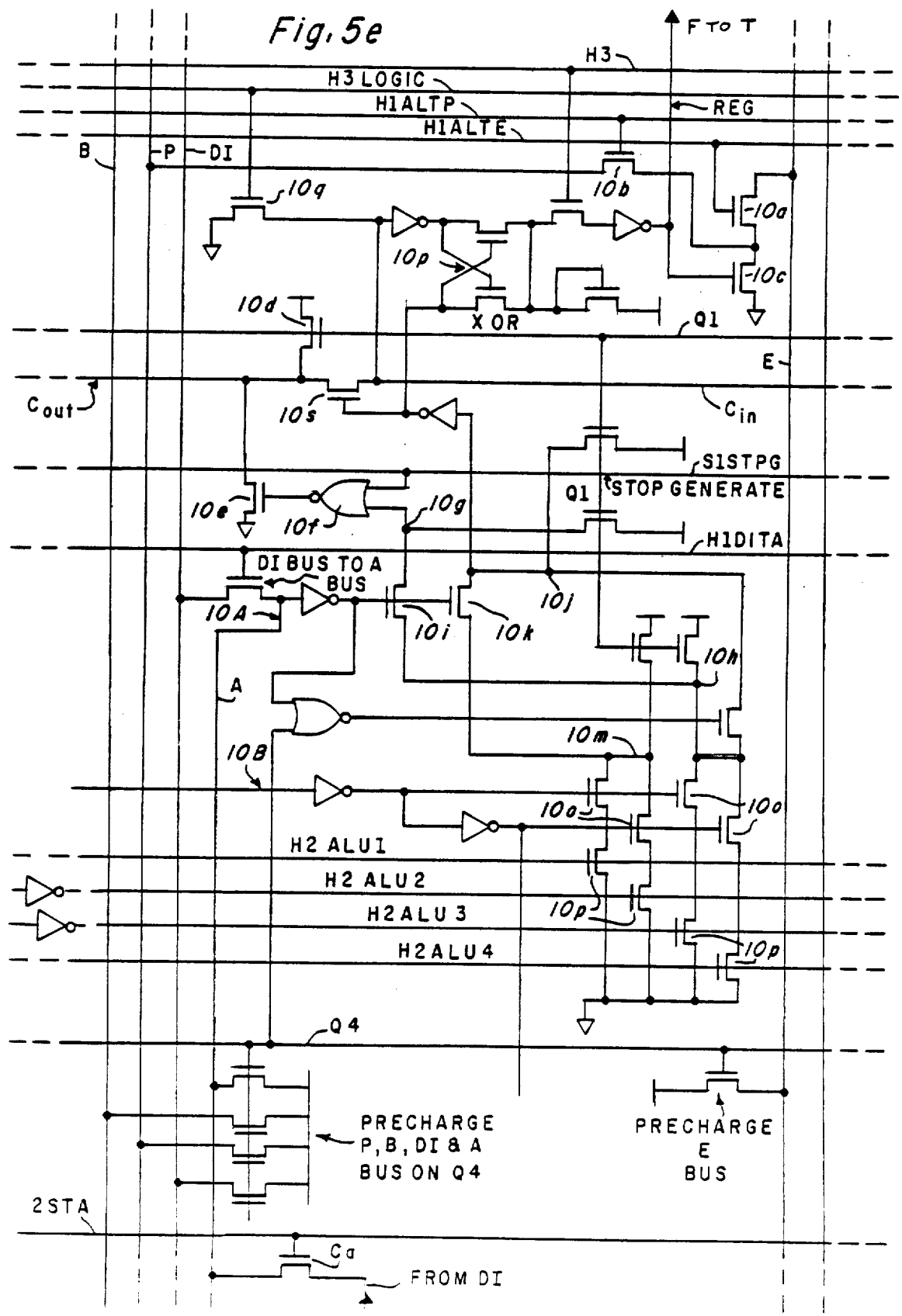

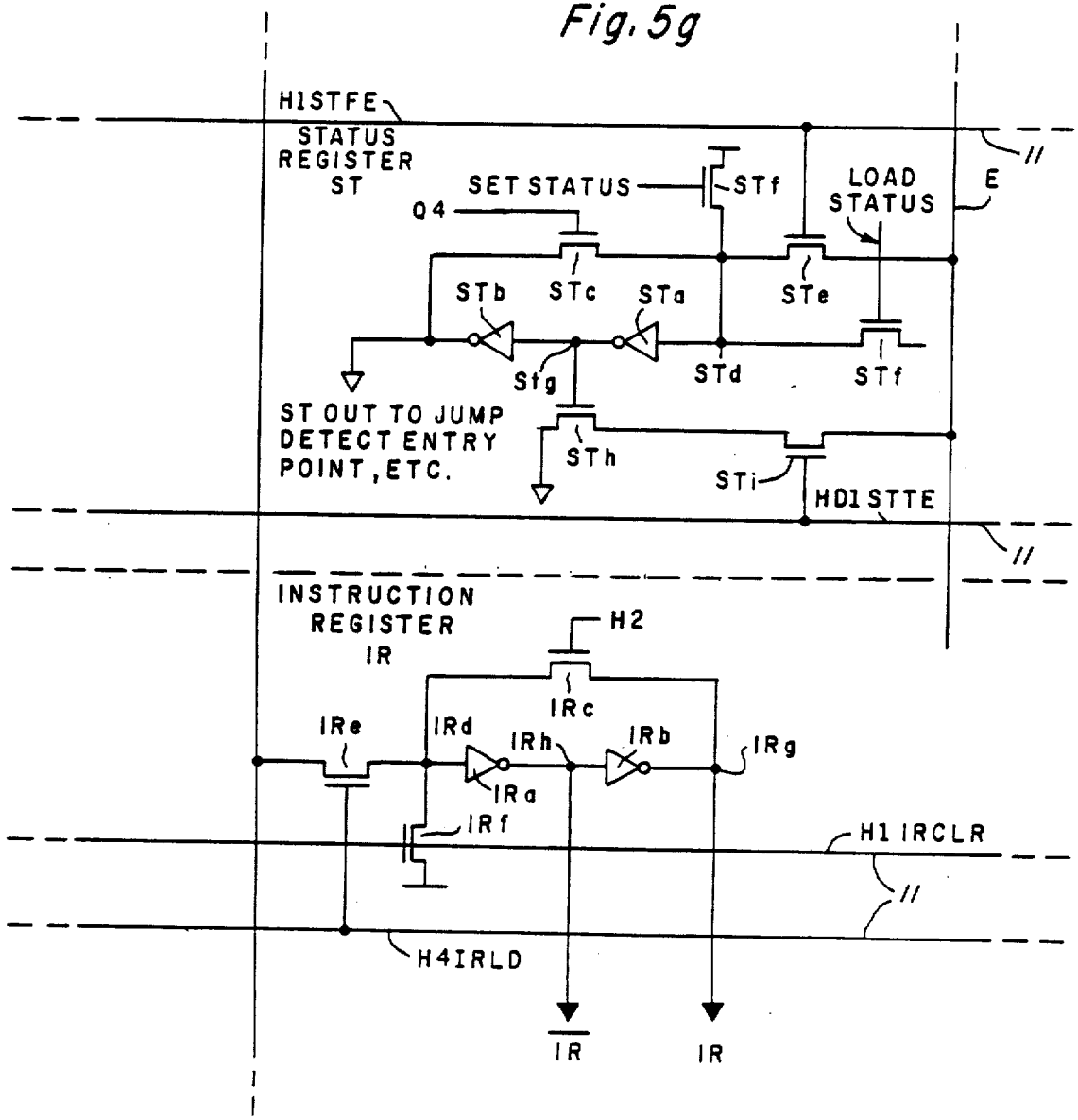

Fig. 7

| STATE TIME | OPERATION | ALU INPUTS/OUTPUT | ADDRESS/DATA BUS 4 | OTHER |
|---|---|---|---|---|
| S1 | PRE-FETCH INSTRUCTION AT ADDRESS IN PC FOR THE ADD OPERATION; PERFORM ALU OPERATION FOR OLD INSTRUCTION | PERFORMS ALU OPERATION FOR OLD INSTRUCTION, RESULT TO E BUS DELAYED | READ CYCLE; ADDRESS FROM PC OUT VIA P BUS AND BUS 4; DATA BACK IN ON BUS 4 TO K REG VIA BUS 5 | INCREMENT PC DEN-ACTIVE |
| S2 | WRITE RESULT OF OLD INSTRUCTION AT OLD DESTINATION ADDRESS; CALCULATE SOURCE ADDRESS FOR NEW INSTRUCTION | ADDS 2S + WP; A INPUT IS S FIELD FOR INCOMING INSTRUCTION WORD OFF DI BUS; B INPUT IS WP VIA B BUS OUTPUT TO E, DELAYED | WRITE CYCLE; DEST. ADDRESS FOR OLD INSTRUCTION ON BUS 4 FROM MA, THEN DATA OUT ON BUS 4 FROM D REG. | LOAD IR VIA DI BUS AND DETERMINE ENTRY POINT FOR ADD INSTRUCTION |
| S3 | FETCH SOURCE OPERAND AT ADDRESS IN MA; CALCULATE ADDRESS OF DESTINATION REGISTER | ADDS 2D + WP A INPUT IS D FIELD FROM INSTRUCTION B INPUT IS WP RESULT TO MA VIA E DELAYED | READ CYCLE; SOURCE ADDRESS OUT FROM MA TO BUS 4; DATA BACK IN ON BUS 4 TO K REG. | DEN-ACTIVE |
| S4 | FETCH CONTENTS OF DESTINATION REGISTER | ADDS 2D + WP AGAIN; RESULT TO MA TO BE USED AS THE DESTINATION WRITE | READ CYCLE; ADDRESS (2D + WP) GOES OUT, CONTENTS OF THAT ADDRESS BACK IN TO BE USED FOR NEXT FETCH | DEN-ACTIVE |
| S5 | FETCH DESTINATION OPERAND | ADDS K PLUS ZERO AND STORES RESULT IN T REG. | READ CYCLE; DESTINATION ADDRESS FROM MA GOES OUT ON BUS 4; DEST. OPERAND COMES BACK ON BUS 4 INTO K REG. | DEN-ACTIVE |
| S6 | PERFORM THE ADD OPERATION FOR THIS INSTRUCTION, AND PRE-FETCH THE CONTENTS OF ADDRESS IN PC FOR THE NEXT INSTRUCTION | PERFORMS ADD OPERATION FOR CURRENT ADD INSTRUCTION. A INPUT IS FROM K, B INPUT IS FROM T VIA F, OUTPUT TO E DELAYED | READ CYCLE; ADDRESS FOR NEXT INSTRUCTION OUT VIA P BUS AND BUS 4; DATA BACK IN ON BUS 4 TO K REG. VIA BUS 5 | INCREMENT PC DEN-ACTIVE |
| S7 | WRITE RESULT OF THIS ADD OPERATION AT DESTINATION ADDRESS; CALCULATE SOURCE ADDRESS FOR NEXT INSTRUCTION | ADDS 2S + WP FOR NEXT INSTRUCTION | WRITE CYCLE; DESTINATION ADDRESS FOR ADD INSTRUCTION GOES OUT ON BUS 4; DATA ON TO BUS 4 FROM D REG. | LOAD IR VIA BUS AND DETERMINE ENTRY POINT FOR NEXT INSTRUCTION |

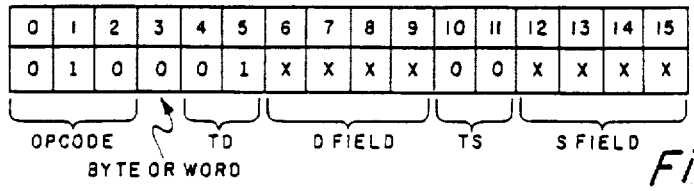

| STATE TIMES; MICROCODE LABEL | CROM 15 ADDR. | OPERATION | ALU | BUS STATUS CODE |
|---|---|---|---|---|
| SCALX | | FETCH SOURCE OPERAND | ADD 2D+WP | |
| SDIV1 | 06 | CALCULATE ADDRESS OF HALF OF OPERAND | ADD 2+WP | 001 |
| 2 | A2 | FETCH REG. 1 ə MA | K TWOS COMPLEMENT RESULT TO D | 110 |
| 3 | 9D | ADDRESS OF OTHER HALF OF OPERAND | ADD ZERO TO WP | 001 |
| 4 | D4 | FETCH REG. 0 ə MA | ADD ZERO TO K, RESULT TO T | 110 |
| 5 | C1 | NEGATE CONTENTS OF D REG. | NEG. D, RESULT TO D | 001 |
| 6 | C2 | | SUBTRACT 0 FROM T WITH CARRY, RESULT TO MQ | 001 |
| 7 | CD | | K, ONE'S COMPLEMENT RESULT TO T | 001 |
| 8 | C7 | | ADD D + T | 001 |
| 9 | 5D | CHECK IF RESULT 16 BITS | | 001 |
| * 10 | C4 | DIVIDE, INCREMENT SC | ADD D TO SHIFT-LEFT T RESULT TO T | 001 |
| * 11 | C5 | DIVIDE, INCREMENT SC | ADD D TO SHIFT-LEFT T, RESULT TO T | 001 |
| 12 | C0 | MQ TO D | | 001 |
| 13 | C6 | | ADD ZERO TO T | 001 |
| 14 | AF | | D TWO'S COMPLEMENT, RESULT TO D, MQ | 001 |
| 15 | A7 | SUBTRACT ZERO FROM T, WITH CARRY | 0 CSUB T, RESULT TO MQ | 001 |
| 16 | A6 | | ADD ZERO TO D, RESULT TO D | |
| 17 | AD | GENERATE ADDRESS FOR | ADD 2 TO MA, RESULT TO MA, INCREMENT PC | 110 |
| 18 | BE | | INCREMENT PC ADD 0 TO MA | 011 |
| DW1 | | DESTINATION WRITE | | |

* ONE OF THESE REPEATS SIXTEEN TIMES, HOLDING CROM 15 ADDRESS IN REGISTER 21, PERFORMING A SINGLE-STATE DIVIDE EACH TIME THEN LEFT-SHIFTING

PSUEDO-MICROPROGRAMMING IN MICROPROCESSOR IN SINGLE-CHIP MICROPROCESSOR WITH ALTERNATE IR LOADING FROM INTERNAL OR EXTERNAL PROGRAM MEMORIES

RELATED CASES

This application discloses subject matter also disclosed and claimed in copending applications Ser. No. 209,914 (now U.S. Pat. No. 4,402,042), Ser. No. 209,915 (now U.S. Pat. No. 4,402,043) Ser. No. 209,917, Ser. No. 210,105 (now U.S. Pat. 4,403,284), Ser. No. 210,107, Ser. No. 210,108, and Ser. No. 210,109 (now U.S. Pat. No. 4,402,044), all filed herewith and assigned to Texas Instruments.

BACKGROUND OF THE INVENTION

This invention relates to integrated semiconductor devices and systems, and more particularly to features used in an electronic digital processing system which may employ a single-chip microprocessor or microcomputer device.

A microprocessor device is a central processing unit or CPU for a digital processor which is contained in a single semiconductor integrated circuit, usually fabricated by "MOS/LSI" technology as shown in U.S. Pat. No. 3,757,306 issued to Gary W. Boone and assigned to Texas Instruments. The Boone patent shows an 8-bit CPU on a chip including a parallel ALU, a register stack, an instruction register and a control decoder, all interconnected using a bidirectional parallel bus. The term microprocessor usually refers to a device which employs external memory for program and data storage, while the term microcomputer refers to such a device which has on-chip ROM and RAM for program and data storage; the terms are also used interchangeably, however. U.S. Pat. No. 4,074,351, issued to Gary W. Boone and Michael J. Cochran, assigned to Texas Instruments, shows a single-chip "microcomputer" type device which contains a 4-bit parallel ALU and its control and circuitry with ROM and RAM for program and data storage.

Subsequent to the time U.S. Pat. Nos. 3,757,306 and 4,074,351 were originally filed many improvements have been made in microprocessors and microcomputers to multiply the speed and capabilities of these devices and reduce the cost of manufacture. Generally, the trend in the semiconductor industry is toward providing more circuitry in less space, i.e., smaller chip size. As photolithographic techniques are improved the line widths and resolutions are improved, providing added density, but circuit and system improvements also contribute to the goals of increased performance with smaller chip size. Some of these improvements in microprocessors are disclosed in the following U.S. Patents, all assigned to Texas Instruments: U.S. Pat. No. 3,991,305 issued to Edward R. Caudel and Joseph H. Raymond Jr.; U.S. Pat. No. 4,156,927 issued to David J. McElroy and Graham S. Tubbs; U.S. Pat. No. 3,934,233 issued to R. J. Fisher and G. D. Rogers; U.S. Pat. No. 3,921,142 issued to J. D. Bryant and G. A. Hartsell; U.S. Pat. No. 3,900,722 issued to M. J. Cochran and C. P. Grant; U.S. Pat. No. 3,932,846 issued to C. W. Brixey et. al.; U.S. Pat. No. 3,939,335 issued to G. L. Brantingham, L. H. Phillips and L. T. Novak; U.S. Pat. No. 4,125,901 issued to S. P. Hamilton, L. L. Miles, et. al.; U.S. Pat. No. 4,158,432 issued to M. G. VanBavel; U.S. Pat. Nos. 3,757,308 and 3,984,816.

The demand for additional capabilities in microprocessor devices at lower cost continues, however, in spite of the advances which have been made in these technologies in recent years. Of course, not only the parts costs is of concern; the major concern is in lowering the cost of software and the amount of memory needed to store the programs, as well as the execution time for complex programs.

Examples of some of the various microprocessor and microcomputer devices in this evolution of the technology are described in publications as well as the above-mentioned patents. In Electronics, Sept. 25, 1972, p. 31-32, a 4-bit P-channel MOS microcomputer with on-chip ROM and RAM is shown which is similar to U.S. Pat. No. 3,991,305. Two of the most widely used 8-bit microprocessors like that of U.S. Pat. No. 3,757,306 are described in Electronics, Apr. 18, 1974 at pp. 88-95 (the Motorola 6800) and pp. 95-100 (the Intel 8080). A microcomputer version of the 6800 is described in Electronics, Feb. 2, 1978 at pp. 95-103. Likewise, a single-chip microcomputer version of the 8080 is shown in Electronics, Nov. 25, 1976 at pp. 99-105 and a 16-bit microprocessor evolving from the 8080 is described in Electronics, Feb. 16, 1978, pp. 99-104. Another single-chip microcomputer, the Mostek 3872, is shown in Electronics, May 11, 1978, at pp. 105-110. A microprocessor which is particularly adapted for digital processing of real-time analog signals, the Intel 2920, is shown at Electronics, Mar. 1, 1979, pp. 105-110. An improved version of the 6800 is disclosed in Electronics, Sept. 17, 1979 at pp. 122-125, while a 16-bit microprocessor identified as the 68000 which evolved from the 6800 is described in Electronic Design, Sept. 1, 1978 at pp. 100-107. Floating point arithmetic is performed in a 16-bit processor called the 8087, used as a co-processor with the 8086, as described in Electronics, May 8, 1980, pp. 114-121.

It is therefore the principle object of the invention to provide an improved microprocessor device and system, and an improved method of constructing and operating such apparatus. Another object is to provide improved performance or capabilities of a microprocessor or microcomputer while at the same time reducing the size (and thus cost) of the semiconductor device needed to implement the desired features. Further objects are to provide: a technique for executing instruction sequences in a microprocessor to emulate complex instructions which are indistinguishable from native instructions; a microprocessor which may be customized without employing micro-code programming; and one which has on-chip memory, not included in the main memory map, for executing complex instructions.

SUMMARY OF THE INVENTION

In accordance with one embodiment of the invention, an improved single-chip microprocessor device of the MOS/LSI type contains an ALU, several interal busses, a number of address/data registers, and an instruction register with associated control decode or microcontrol generator circuitry. The device communicates with external memory and peripherals by a bidirectional multiplexed address/data bus and a number of control lines. In addition to the main off-chip memory, a small on-chip memory (including both ROM and RAM) is provided which allows execution of instruction sequences to emulate complex instructions or interpretors (macro-instructions) which are indistinguishable from "native" instructions since all memory fetches are generated exactly the same way, and long instruction sequences are interruptable. This on-chip memory does not affect the off-chip main memory map.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

A detailed description of the microprocessor referred to herein is set forth in U.S. Pat. No. 4,402,044, issued from an application Ser. No. 210,109, filed herewith on Nov. 24, 1980 and assigned to Texas Instruments; such Patent is incorporated herein by reference.

Microprocessor System

Figure 1:
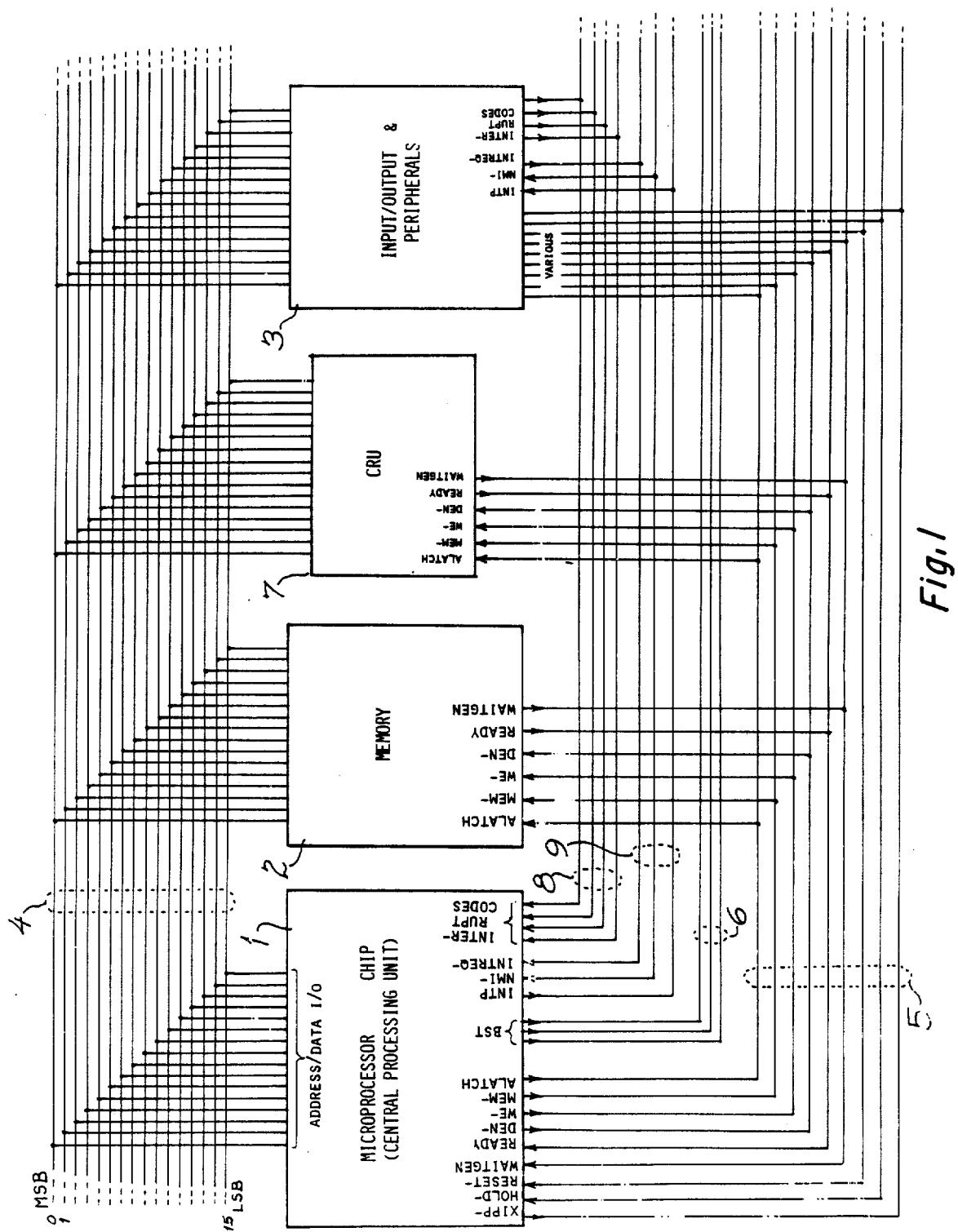
FIG. 1 is an electrical diagram in block form of a microprocessor system which may employ features of the invention.

The microprocessor device to be described herein may be of various configurations; in one embodiment the microprocessor device may be used in a system shown in generalized form in FIG. 1. The system may be, for example, a single-board general purpose microcomputer, a word processing system, a computer terminal with display and typewriter keyboard, a communications switching or processing system, or any of many applications of this type. The system includes a single-chip MOS/LSI central processing unit or microprocessor 1 which will be described in detail, along with a memory 2 and input/output or I/O device 3. The microprocessor, memory and I/O communicate with one another by a 16-bit, parallel, bidirectional, multiplexed address/data bus 4, along with control lines 5. Suitable supply voltage and clock terminals are included; for example the device may employ a single +5V Vcc supply and ground or Vss, and a crystal may be connected to terminals of the device 1 to control the frequency of an on-chip oscillator which will then define the system timing. It is understood that concepts of the invention may be used in a single-chip microcomputer with on-chip memory instead of the off-chip memory 2, as well as in a microprocessor having separate address and data busses instead of the bidirectional bus 4.

In general terms, of course, the system of FIG. 1 functions in traditional manner. The microprocessor 1 fetches an instruction by sending out an address on the bus 4 to the memory 2 then receiving the instruction via the bus 4 from the addressed location in the memory 2. The microprocessor then executes this instruction, which usually requires several machine cycles (as defined by a clock or crystal) including sending out via bus 4 addresses for the operands stored in the memory 2, and receiving this data back on bus 4, as well as writing a result into memory 2 by an address followed by data on the bus 4. The I/O devices 3 may be addressed like memory 2; this interface to external devices is accomplished using the address/data bus 4 and control lines 5 since the I/O devices 3 occupy locations in the memory address space. This is known as memory-mapped I/O.

Figure 2A:
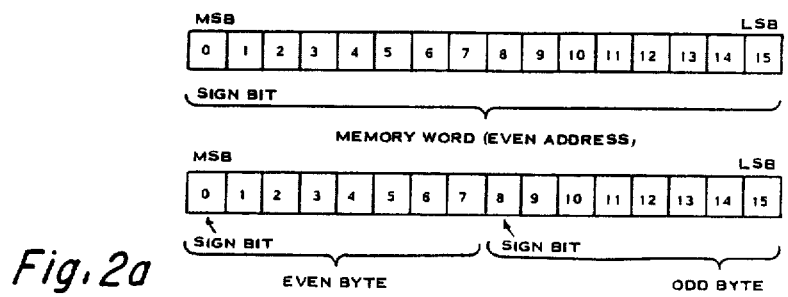
FIG. 2a is a diagram of the word, byte and bit definitions of the 16-bit data word used in the system of FIG. 1.

In the example to be described in detail, a 15-bit address is applied to the bus 4 from the microprocessor 1 (the 16th bit is a hardwired 0 for addressing), which will directly address $2^{15}$ or 32K words of memory. Each 16-bit word in memory includes two 8-bit bytes, so the microprocessor can address 64K bytes. The instruction set of the microprocessor 1 allows either word or byte operations. FIG. 2a shows the data word and byte formats and bit definitions for the system of FIG. 1 as described herein. Words are assigned even numbered addresses in memory 2. A 16-bit byte address is explicitly manipulated by all addressing modes, internally, but only the 15-bit word address is provided to the memory system 2 via bus 4, providing direct addressing of a 32K word memory space. The CPU device 1 supports several methods of increasing the amount of physical memory space which it can address, including paging, functional separation and mapping. Paging is accomplished by using a status bit on one of the control lines 5 as a 16th address bit. Functional separation is accomplished using "bus status codes" on BST lines 6 to enable separate memory spaces for instructions or data. Mapping is accomplished by using external map logic devices which are managed by mapping instructions; this may extend the physical address range to 16M bytes or $2^{24}$, meaning the equivalent of a 24-bit address.

Figure 2B:
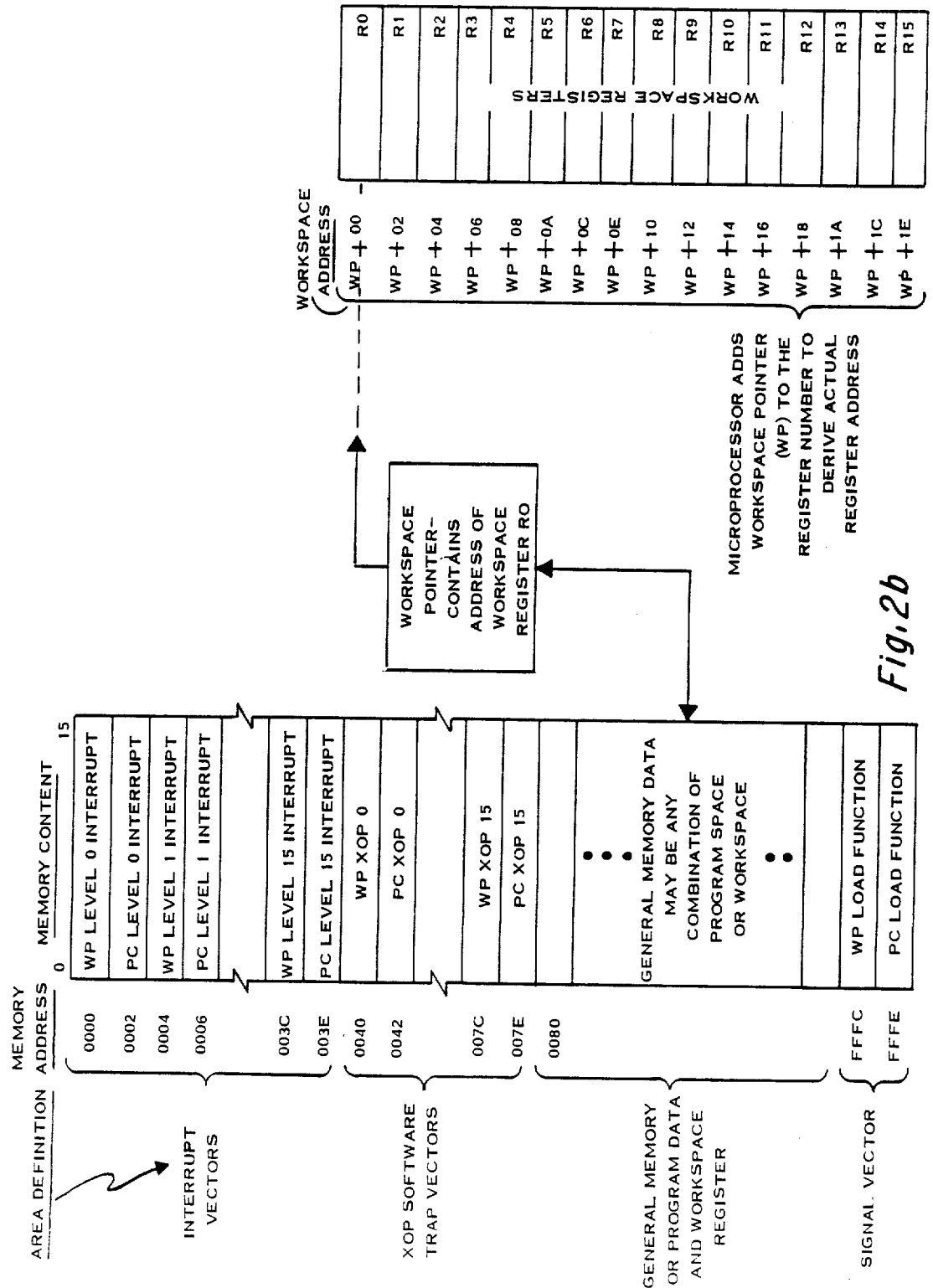
FIG. 2b is a memory map for the main memory 2 of FIG. 1 and a diagram of a number of adjacent memory locations in the general memory area referred to as a "workspace"
Figure 2D:
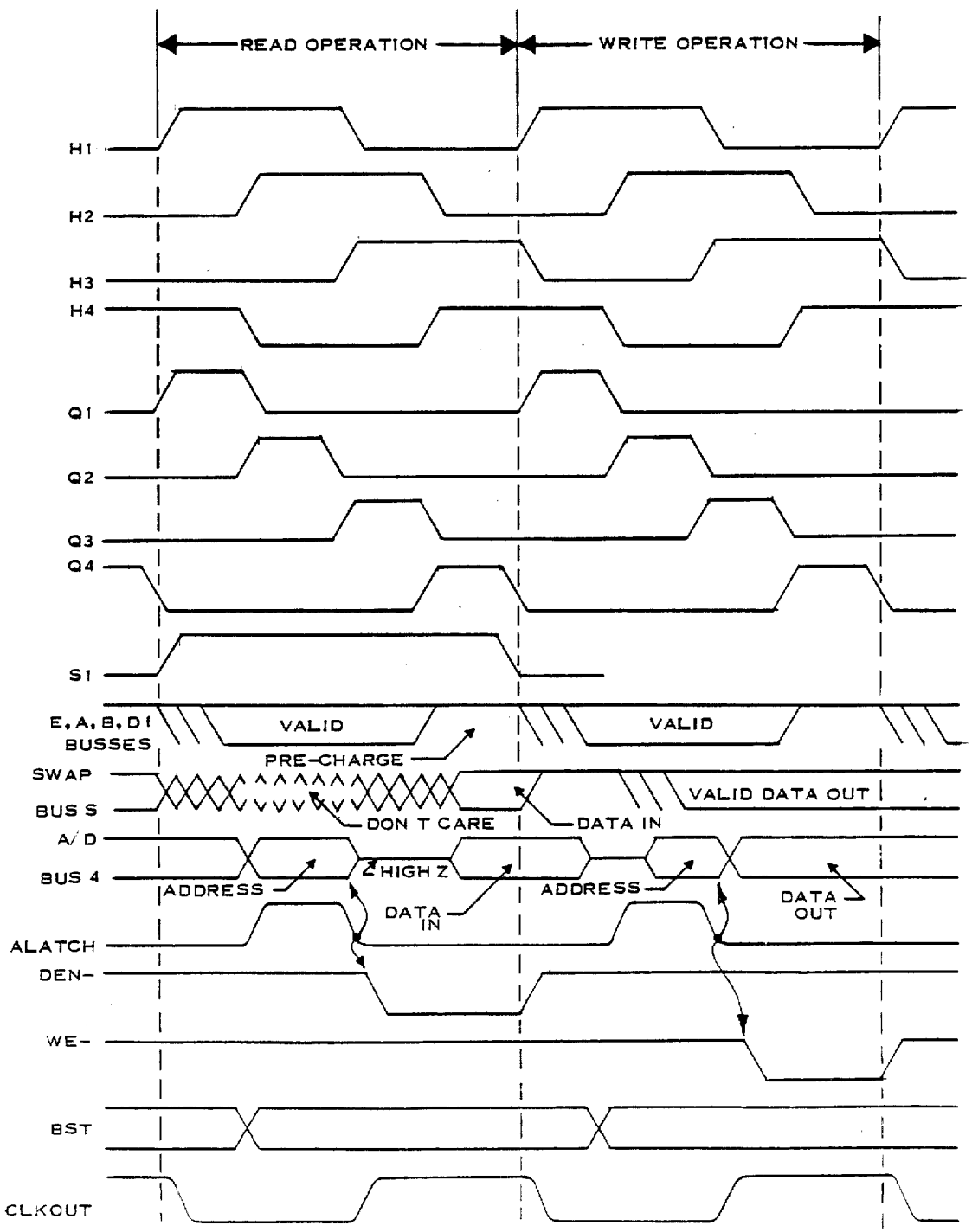
FIG. 2d is a timing diagram showing voltage vs. time for the system of FIG. 1.

The system of FIG. 1 employs a memory-to-memory architecture in which the register files or working registers used by the CPU reside in the external memory 2 rather than in the microprocessor chip 1. This type of architecture allows faster response to interrupts and increased programming flexibility, compared to the traditional method of having most operands and return addresses stored in registers on the chip 1. The bulk of memory 2, particularly addresses 0080 to FFFA (all addresses are given in hexidecimal or base-16 in this description), is available for program storage or for "workspaces" as seen in FIG. 2b. The first word of a workspace is addressed by a workspace pointer (always an even address) and the remaining fifteen words are addressed by the workspace pointer plus 02 up to 1E (a 4-bit binary address). By maintaining the working registers in memory 2, a context switch or interrupt can be executed with a minimum of data transfer between microprocessor 1 and memory 2 because most of the data to be saved is already in the memory 2.

In addition to the parallel I/O 3, the system includes a bit-addressable input/output capability using a communications register unit or "CRU" 7 which employs one of the terminals (bit-0) of the address/data bus 4 as an input and another (bit-15) as an output, along with the lines 5 as control.

Interrupts are provided by four input lines 8 which define sixteen interrupt codes, sampled by the CPU 1 when an interrupt request line (one of three interrupt controls among the lines 9) is active and compared internally with an interrupt mask. If the code on the lines 8 is equal to or higher in priority than the mask, the interrupt sequence is initiated. If the comparison fails, the processor ignores the request. Another one of the control lines 9 produces a non-maskable interrupt, wherein priority codes on lines 8 are not material.

The system permits direct memory access (DMA) in which large blocks of memory words may be transferred via bus 4 between memory 2 and an I/O device 3 such as a disc memory. A "hold" command on one of the control lines 5 indicates to the processor 1 that an external controller desires to use the bus 4, so the processor enters a hold state with its terminals going to the bus 4 in a high impedance state.

A definition of the function of each of the control lines 5, bus status lines 6 and interrupt controls is given in Table A of said referenced patent. The status bits for a sixteen bit status register ST are shown in Table B of said reference patent where the conditions for setting each bit for instructions in the instruction set are defined. A definition of the interrupt levels is given in Table C of said reference patent. Of course, this specific system is merely illustrative of contemporary microprocessor or microcomputer systems in which features of the invention may be used.

The CPU chip 1 of FIG. 1 executes the instruction set of Table D of said reference patent, although it is understood that other instructions could be defined for execution in addition to or in place of the particular ones described. Most of the instruction set of Table D is the same as that of a microprocessor sold by Texas Instruments under the part number TMS9900 and described in a book entitled "9900 Family Systems Design", published in 1978 by Texas Instruments Incorporated, P. O. Box 1443, M/S 6404, Houston, Tex. 77001, Library of Congress Catalog No. 78-058005; such book is incorporated herein by reference. The instructions of Table D of said reference patent which were not executed by the TMS9900 are: Signed Multiply and Division; long word add, substract, shift left and shift right, Branch Indirect; Branch & Push Link; long distance; Load Status and Load Workspace Pointer; Load Map File; and multiprocessor support instructions Test, Test & Clear, and Test & Set.

The source and destination addressing modes available in executing this instruction set are set forth in said reference patent. Generally, the two-bit T fields Td and Ts (bits 4-5 and 10-11) define the addressing modes in instructions such as Add, Subtract, Move, Compare and the like.

The 16-bit opcodes for the instructions of Table D are shown in FIG. 2c which occupies three sheets. FIG. 2c is arranged in descending order to show the groups (based on the left-most or most-significant "1") which are used in the entry point generator circuitry as will be explained.

THE CPU CHIP

Figure 3:
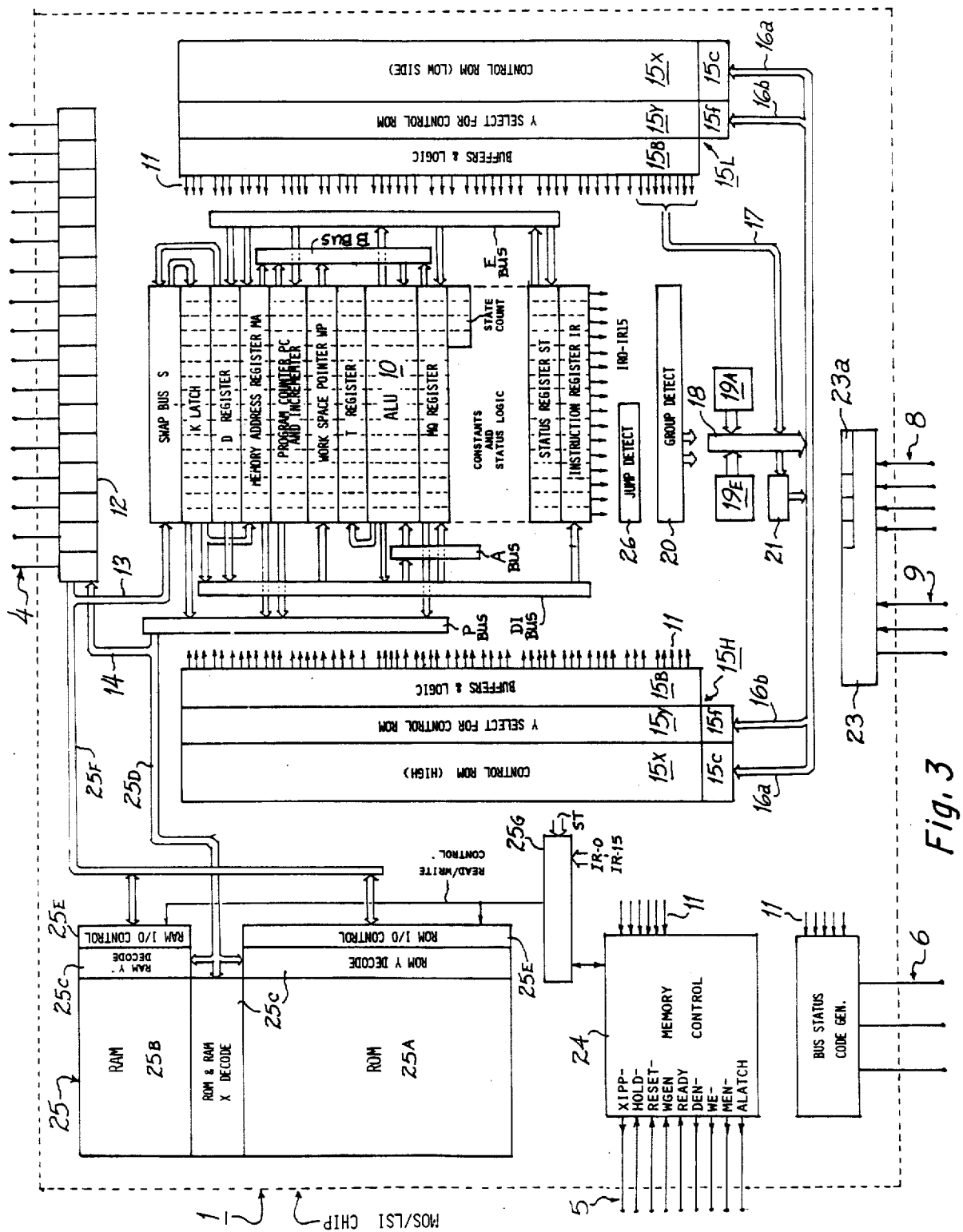
FIGS. 3 and 3a is an electrical diagram in block form of a MOS/LSI microprocessor chip including a CPU or central processor unit employed in the microprocessor system of FIG. 1 and utilizing features of the invention.
Figure 3A:
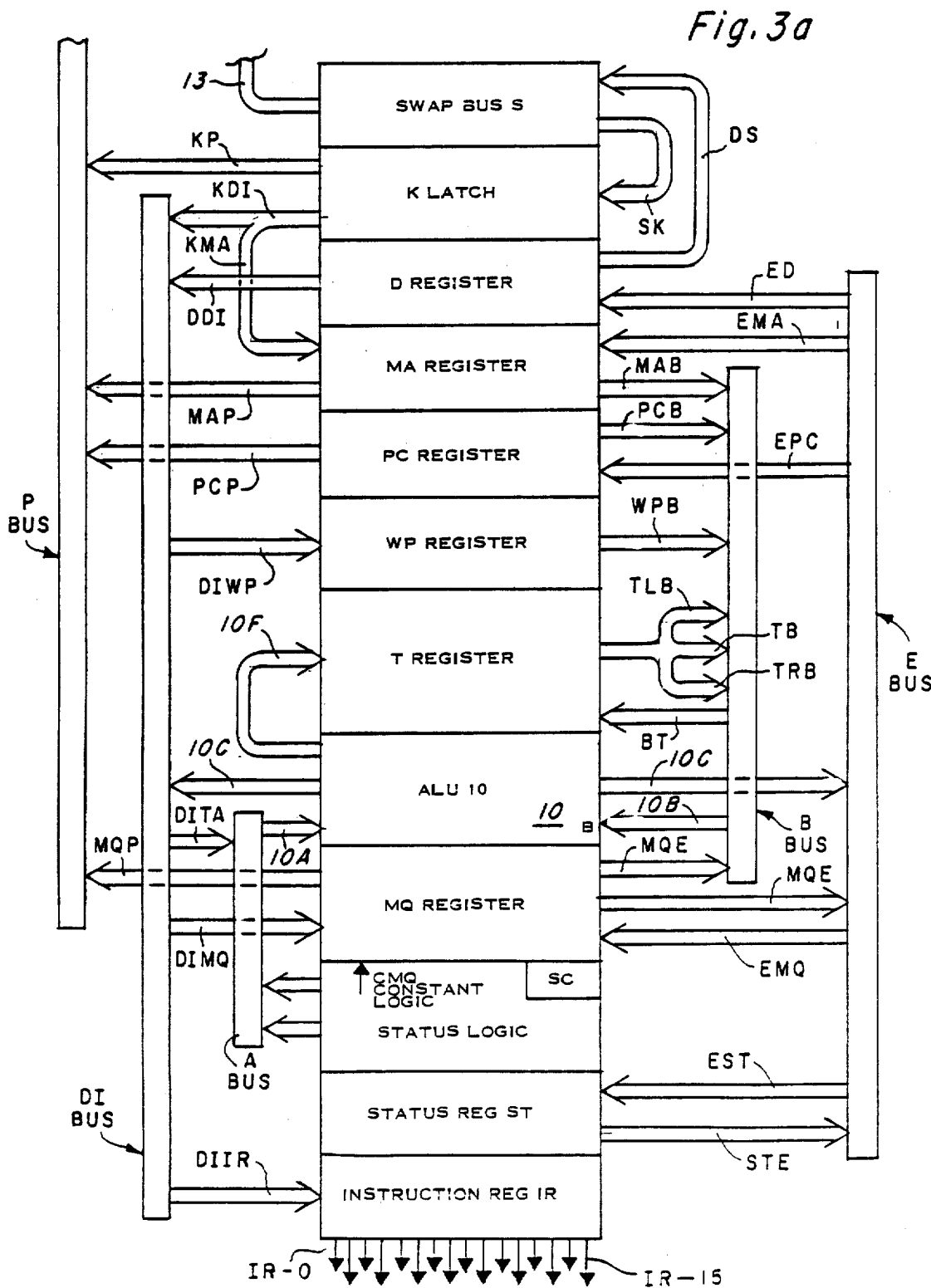
Figure 4:
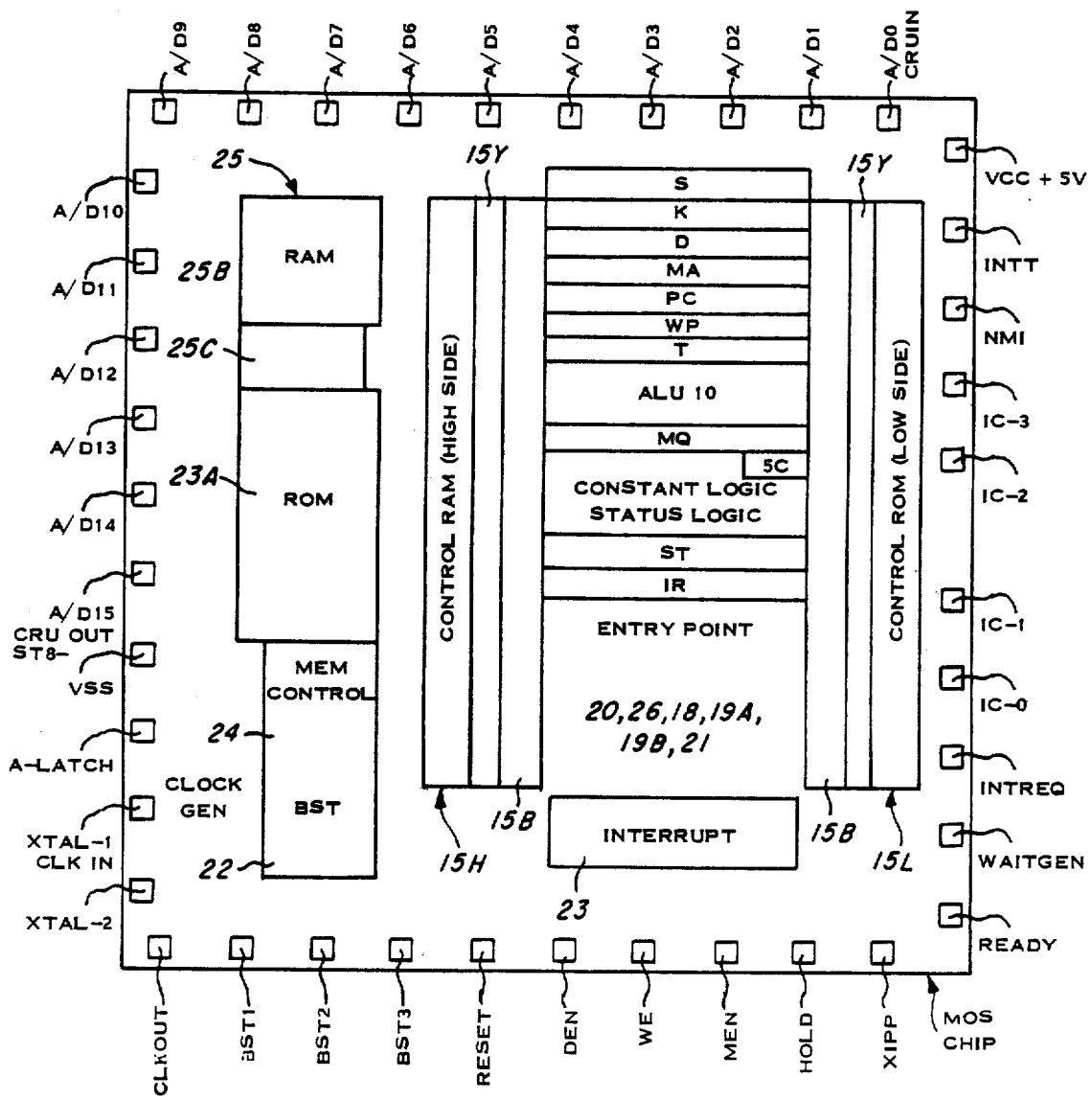
FIG. 4 is a greatly enlarged plan view of the semiconductor chip containing the microprocessor of FIG. 3 showing the physical layout of the various parts of the device.
Figure 40:
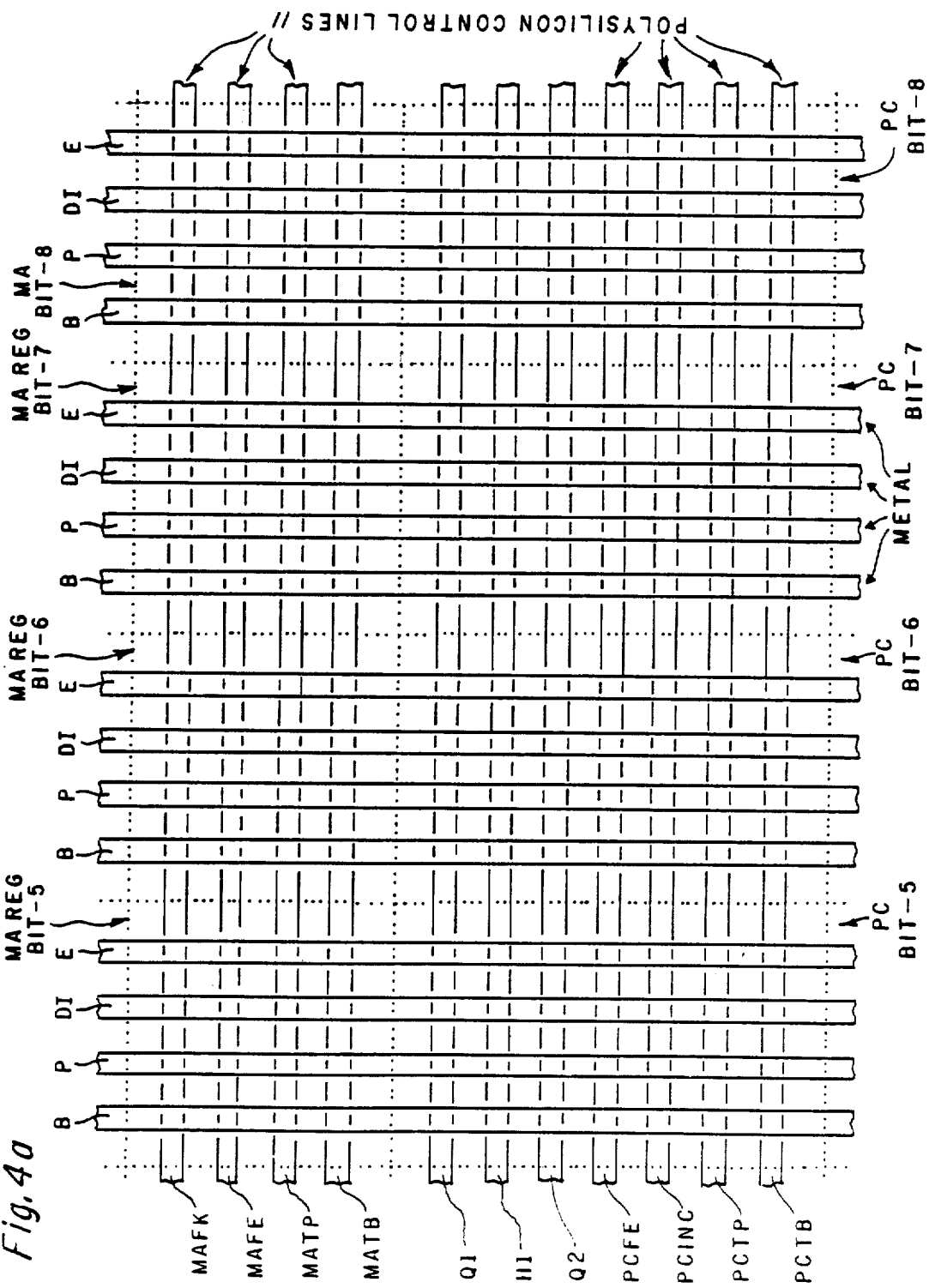
Figure 5A:
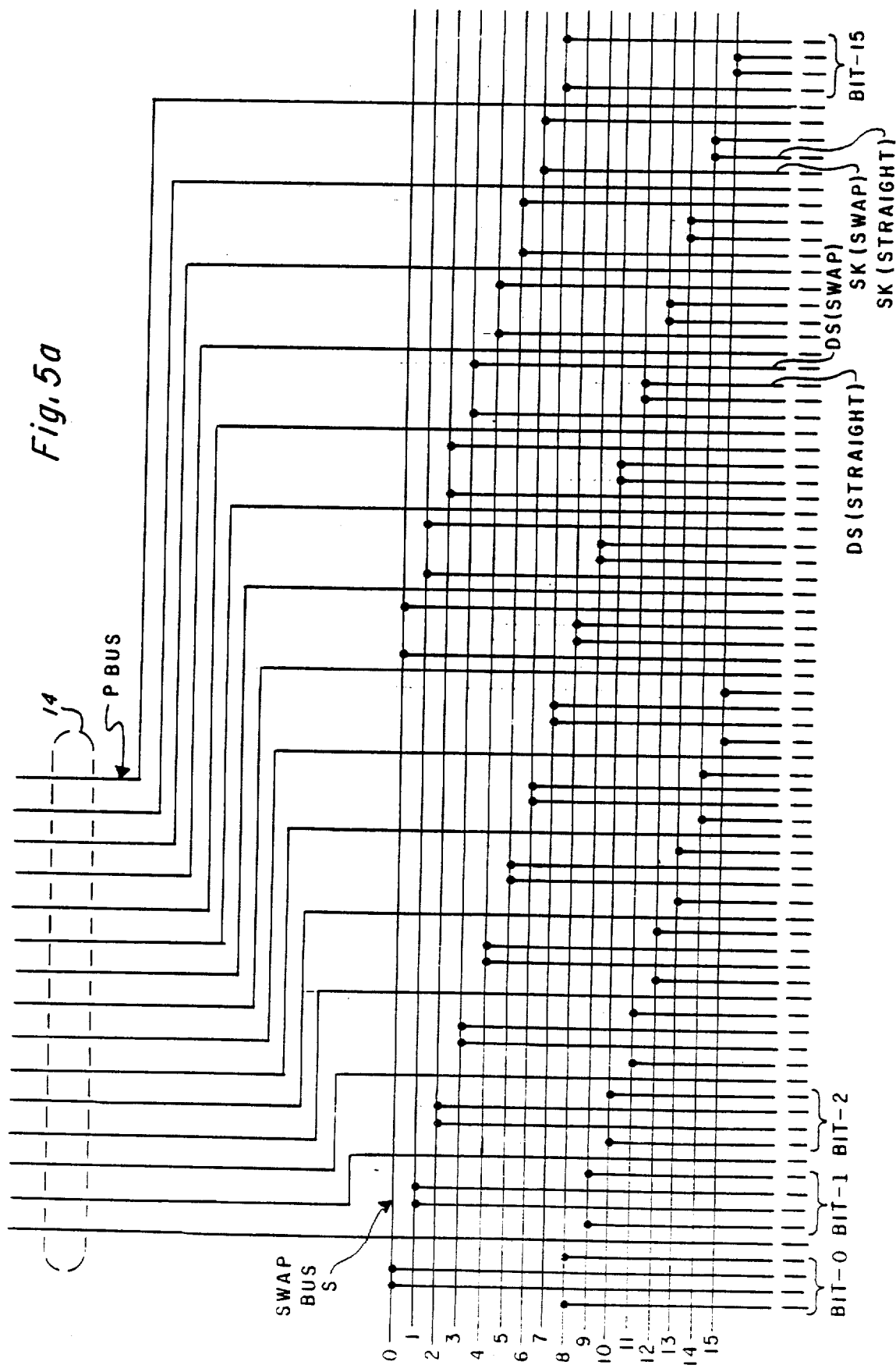
Figure 5B:
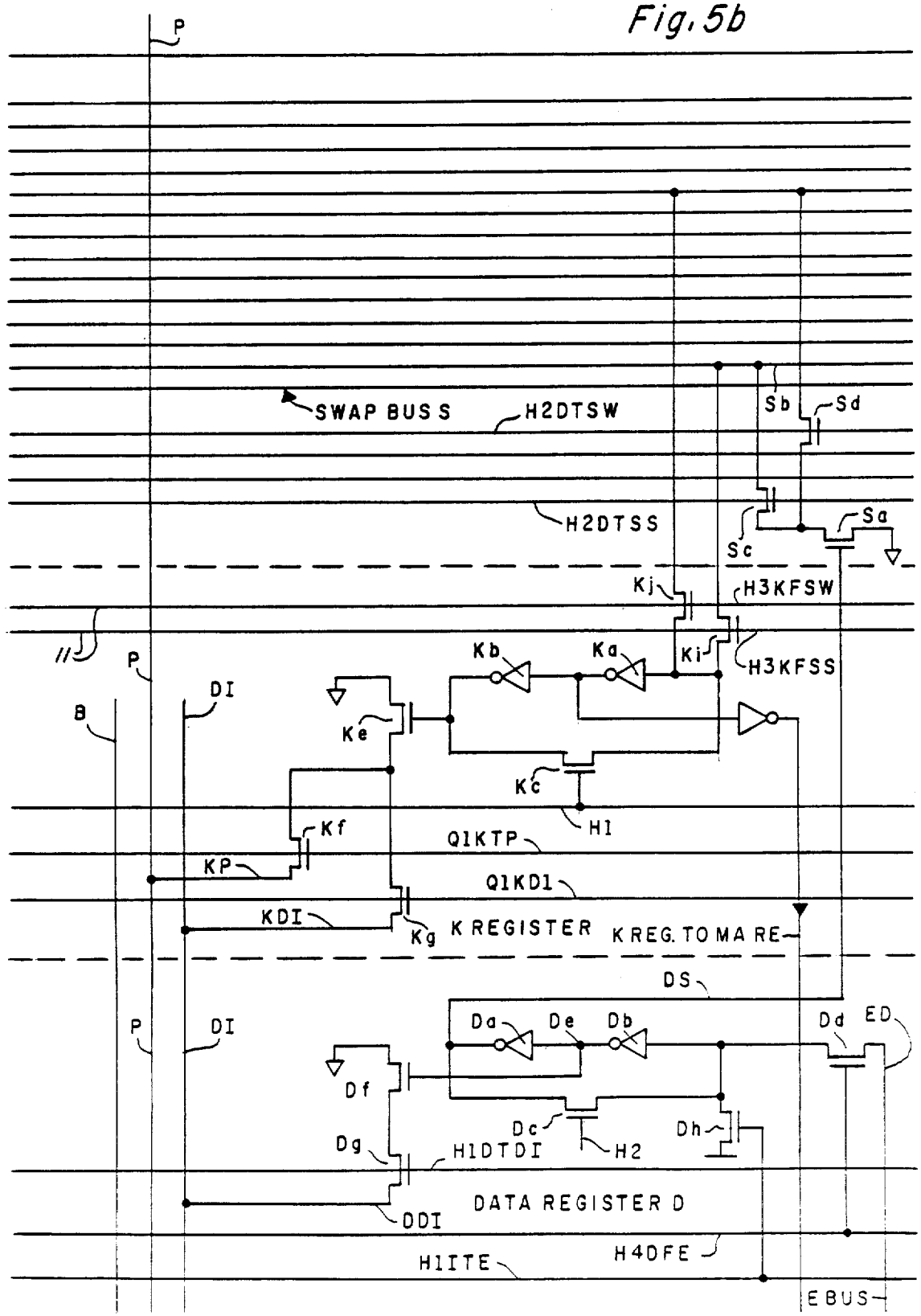
Figure 5D:
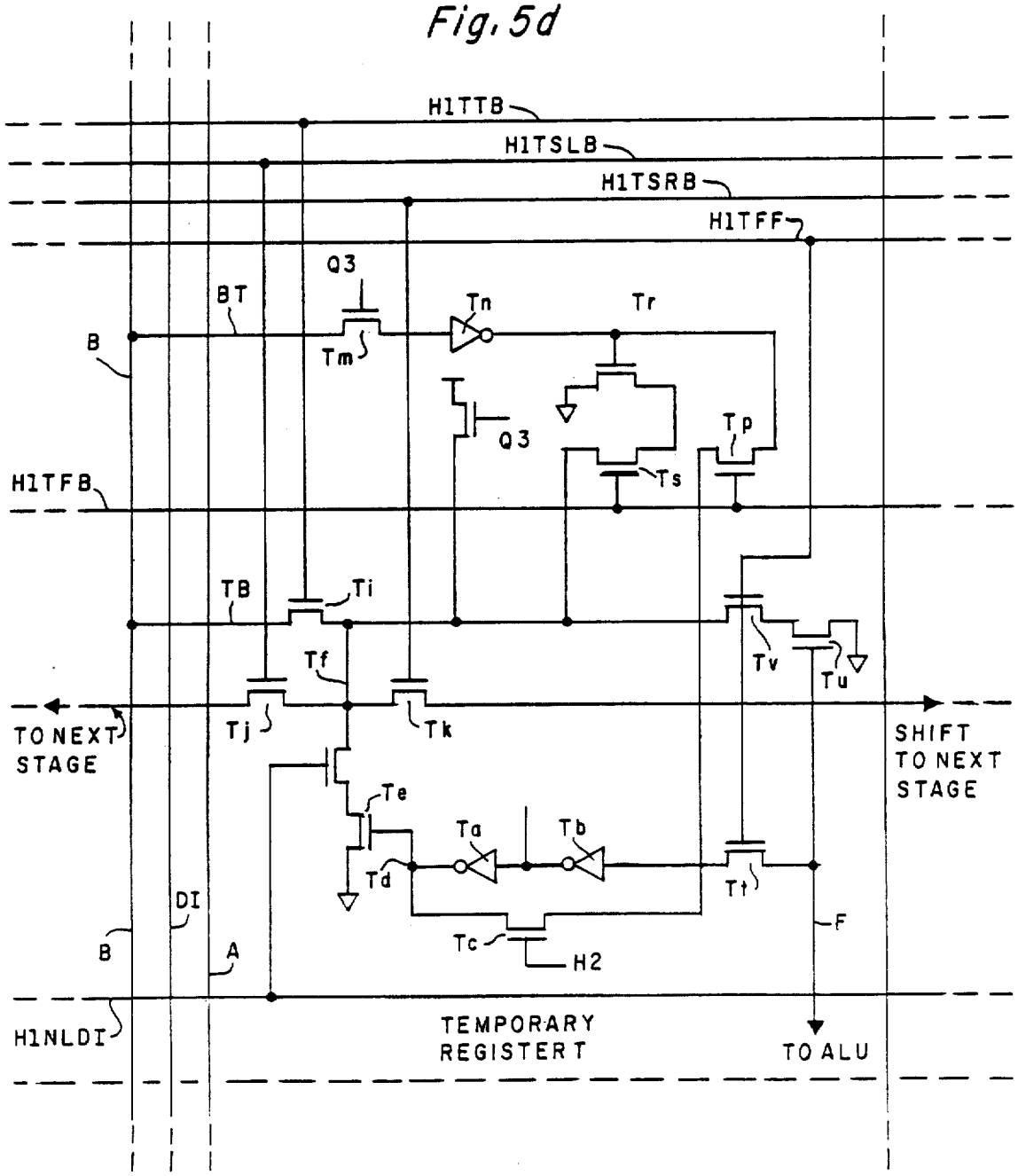
Figure 5F:
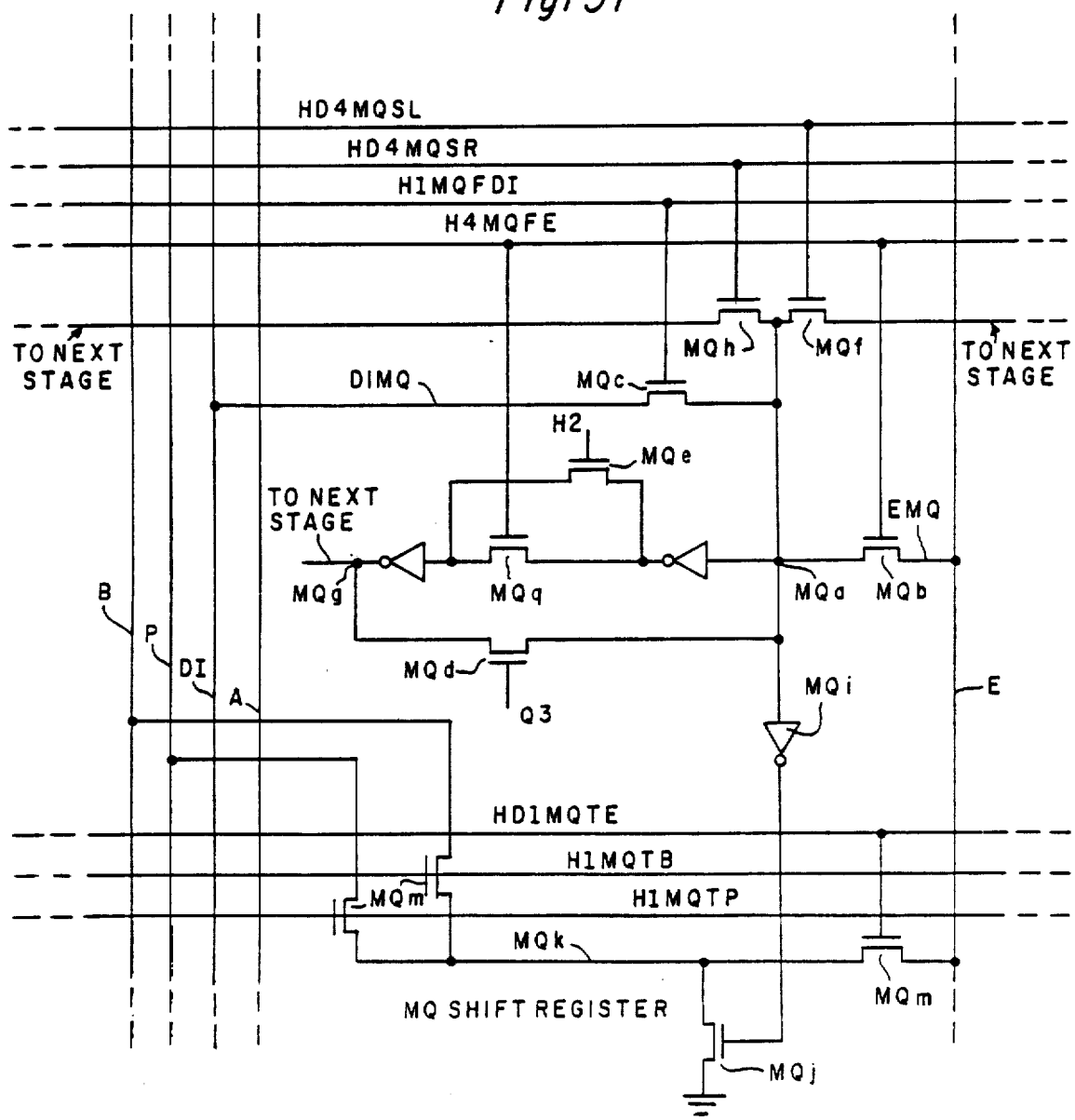
Figure 6:
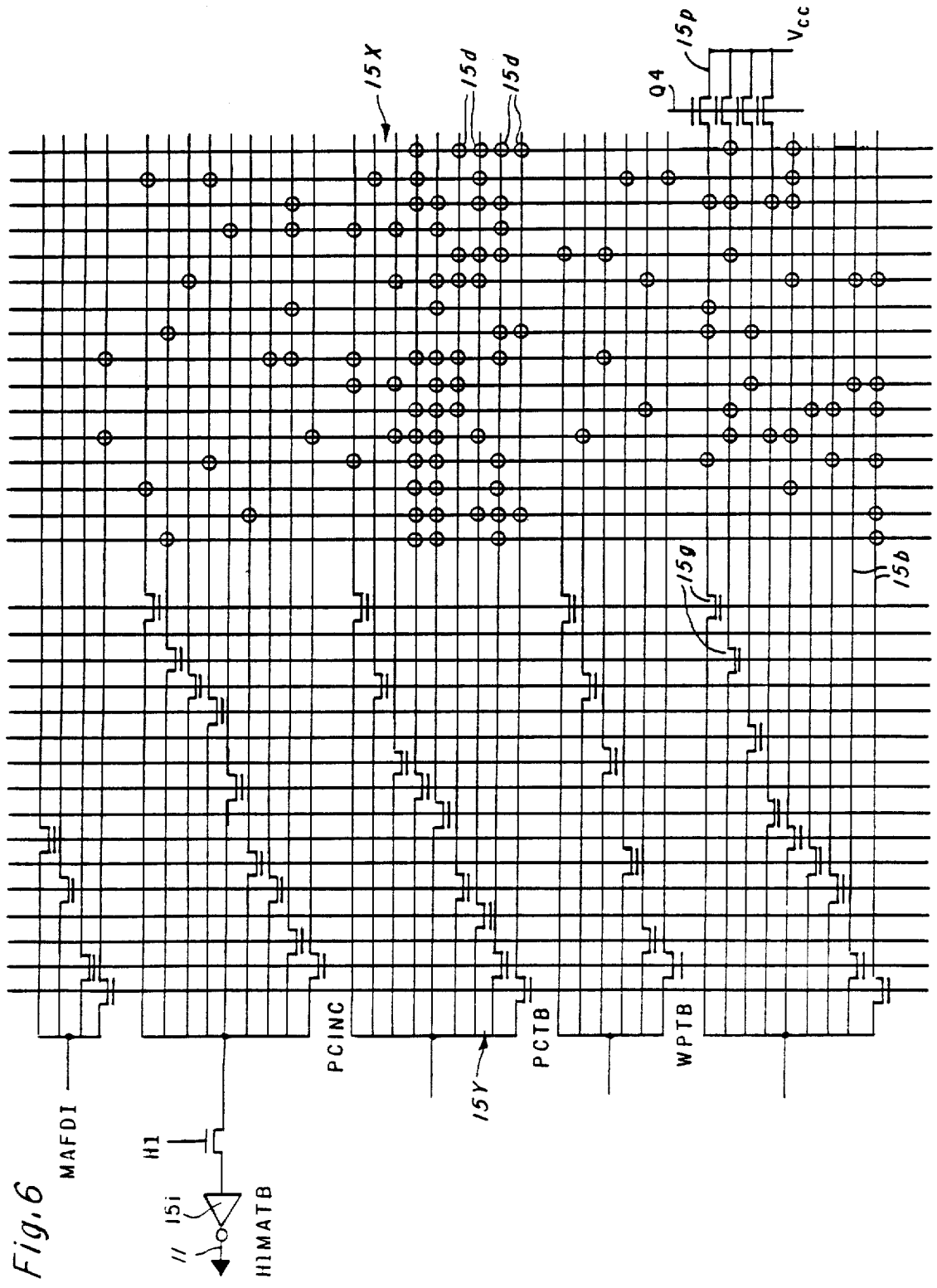
Figure 6:
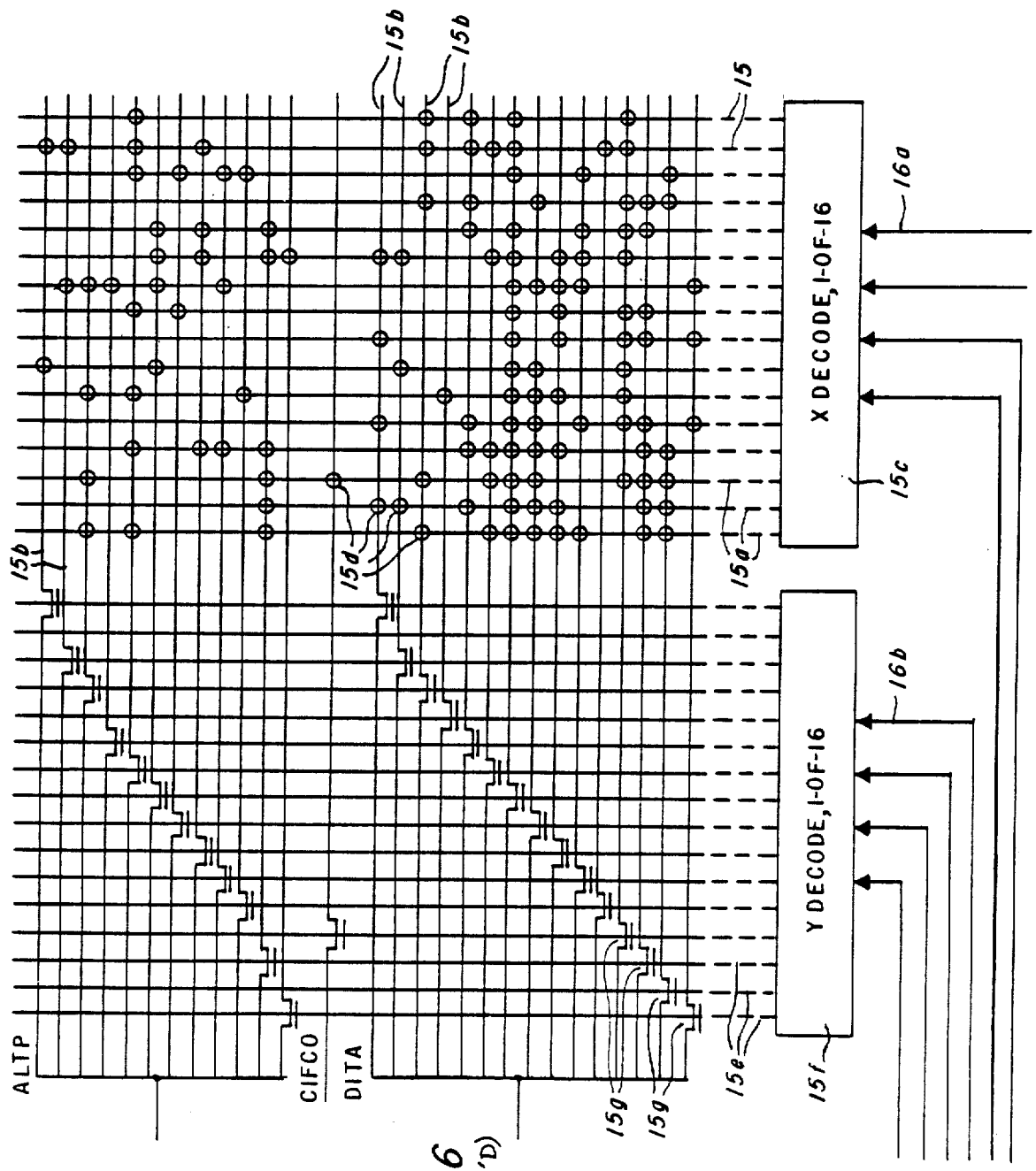
Figure 6A:
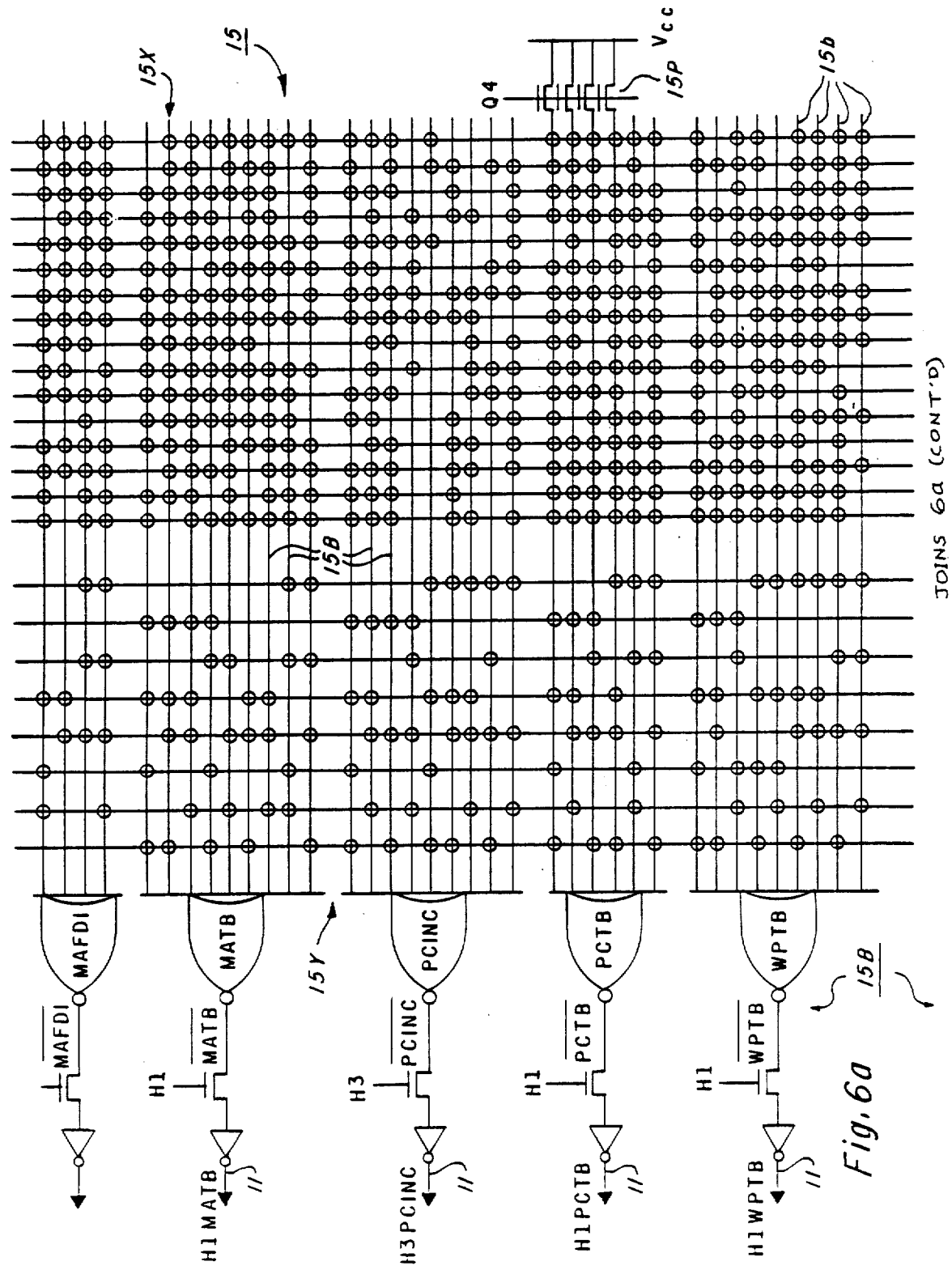
Figure 6A:
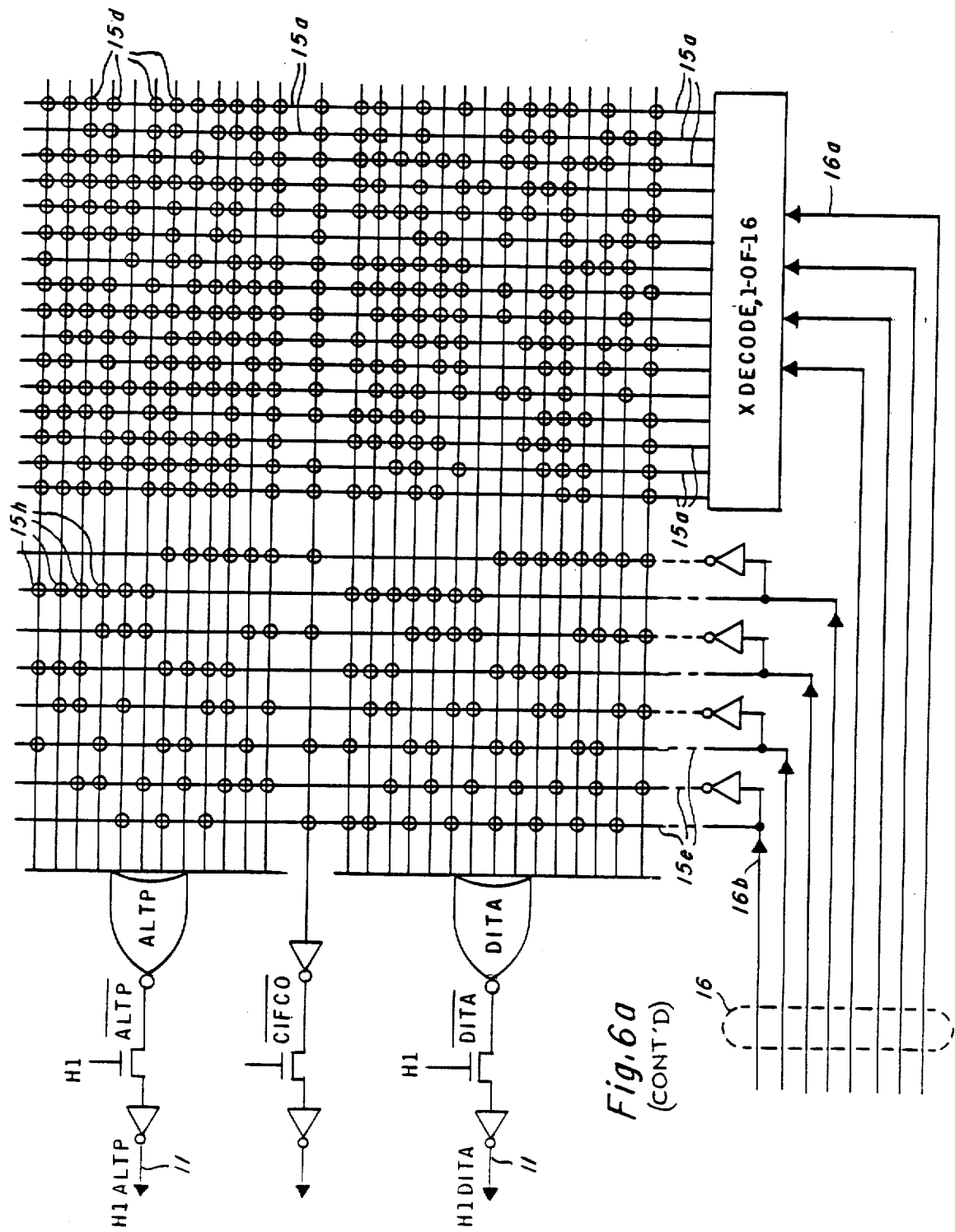
Figure 6B:
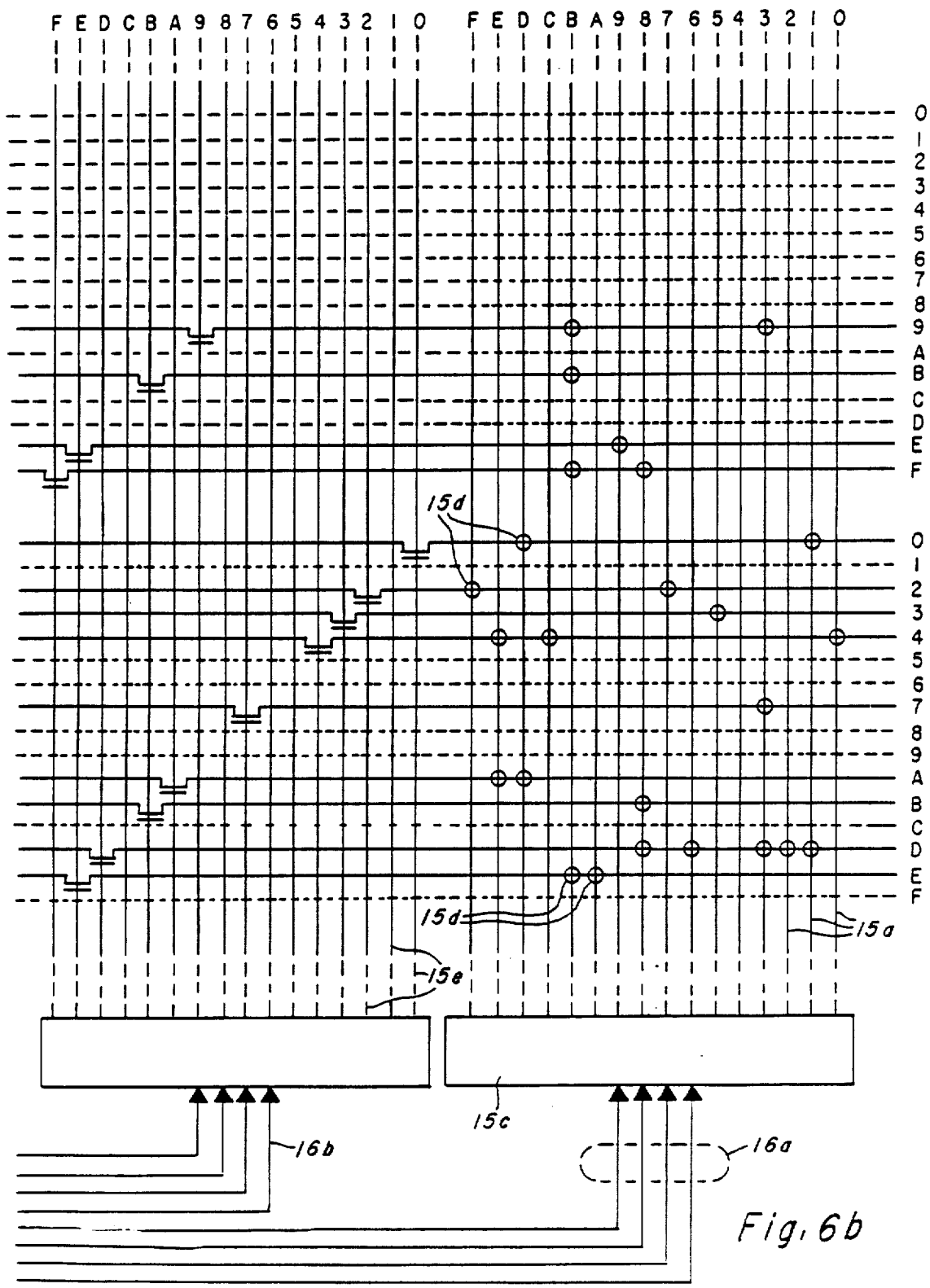

The processor architecture within the CPU chip 1 is shown in block diagram form in FIG. 3, in chip layout form in FIG. 4, and in logic diagram form in FIGS. 5 and 6. Generally, the processor includes an ALU or arithmetic logic unit 10 along with its associated registers, controls, data paths and related logic circuitry. This ALU is adapted for use in the system of FIG. 1, but features of this CPU architecture may be used in other similar systems.

The ALU 10 consists of sixteen parallel binary adder/logic states which function as the computational component of the processor. The ALU 10 receives a 16-bit "A" input 10A and a 16-bit "B" input 10B to produce a 16-bit parallel output 10C. The A input 10A of the ALU is from a 16-bit parallel A bus. The data on the A bus is active low; the indicators $\overline{A}$, A-, or NA should be used in referring to this bus to be technically accurate, and the same is true of the other busses. The A bus may receive data from any one of several sources as will be described, with selection of inputs being made by control inputs 11. Similarly, the B input 10B is from a 16-bit parallel B bus which may receive data from any one of several sources as defined by control inputs 11. The output 10C from the ALU 10 goes to either a P bus or an E bus under control on inputs 11. The ALU performs all the arithmetic and logic functions required to execute microinstructions in the processor such as the functions of addition, subtraction, AND, OR, exclusive OR, complement, etc. as needed for the instructions of Table D of said reference patent. The processor has a number of registers associated with the ALU 10, only three of which are accessable to the programmer. These three are a program counter or PC register, a workspace pointer or WP register, and a status register ST. Other internal registers which are used during the acquisition or execution of instructions are inaccessable to the programmer.

The program counter PC is a 15-bit counter that contains the word address of the next instruction following the instruction currently executing. The fifteen stages are left-justified with the 16-bit hardwired to 0; instructions in the memory 2 are constrained to word boundries, so a single byte is not accessed, only even addresses (words) can be used. The microprocessor references this address to fetch the next instruction from memory 2 and the program counter PC increments the address when the new instruction is executing. If the current instruction in the microprocessor 1 alters the contents of the program counter PC, then a program branch occurs to the location in memory 2 specified by the altered contents of the program counter. All context switching operations, such as interrupts, plus simple branch and jump instructions, affect the contents of the program counter. The program counter can be loaded from the E bus by lines EPC, or its contents applied to the B bus via lines PCB or alternatively to the P bus via lines PCP. All such transfers to or from the program counter are defined by control inputs 11, of course. Internally, the program counter PC includes binary add circuitry to add-1 to the count contained in the 15-bit register at the proper time, again under control of an input 11.

The status register ST is a 16-bit register that contains the results of program comparisons, indicates program status conditions, and supplies interrupt mask level to the interrupt priority circuits. Each of the sixteen bit positions in the status register signifies a particular function or condition that exists in the microprocessor 1; these bit position assignments are shown in Table B. Some instructions use the status register ST to check for a prerequisite condition; others affect the values of the bits in the register; and others load the entire status register with a new set of parameters. Interrupts also modify the status register. The detailed description of the instruction set (Table D) shows the effect of each instruction on the status register. All sixteen bits of the status register ST may be loaded from the E bus via lines EST or loaded onto the E bus via lines STE, upon a command on the control lines 11.

The processor 1 uses blocks of words in the memory 2, called workspaces, for instruction operand manipulation instead of internal hardware registers. A workspace occupies sixteen contiguous memory words as in FIG. 2b, in any part of memory 2 that is not reserved for other use. The individual workspace registers may contain data or addresses, and function as operand registers, accumulators, address registers, or index registers. Some workspace registers are dedicated to take on special significance during execution of certain instructions, as seen in Table D. A large number of these 16-word workspaces may exist in the 32K words of memory 2, providing a high degree of program flexibility. To locate the workspace in memory 2, the hardware register WP or the workspace pointer is used. The workspace pointer WP is a 15-bit register (left justified with 16th or LSB hardwired to 0) that contains the memory address of the first word in the workspace of FIG. 2b.

The processor accesses any register in the workspace of FIG. 2b by adding twice the register number to the contents of the workspace pointer and initiating a memory request for that word. The 16th bit is 0 so this is equivalent to adding two times the register number to WP. FIG. 2b illustrates the relationship between the workspace pointer and its corresponding workspace in memory. The WP register is loaded onto the B bus via lines WPB, or loaded from the DI bus via lines DIWP, under command of the control lines 11.

This workspace concept is particularly advantageous during operations that require a context switch, which is a change from one program to another, as in the case of a subroutine or an interrupt. Such an operation using a conventional multi-register arrangement requires that at least part of the contents of the register file be stored and reloaded, using a memory cycle to store or fetch each word. The processor 1 accomplishes this operation by changing the workspace pointer WP. A complete context switch requires only three store cycles and three fetch cycles, exchanging the program counter PC, status register ST, and workspace pointer WP. After the switch, the workspace pointer WP contains the starting address of a new 16-word workspace (FIG. 2b) in memory 2 for use in the new routine. A corresponding time savings occurs when the original context is restored. As seen in Table D of said reference patent, instructions in the processor 1 that result in a context switch include: Branch and Load Workspace Pointer (BLWP), Return from Subroutine (RTWP), and an Extended Operation (XOP) instruction; device interrupts, the arithmetic overflow interrupt, illegal op-code detection trap, and others also cause a context switch by forcing the processor to trap to a service subroutine.

The internal registers not accessable to the user (programmer) in the processor 1 include a memory address or MA register, a data or D register, and a K register. The D register is connected as input to a swap bus S via parallel lines DS, and a swap bus output on lines SK may be applied to the K register, all under control of commands on the lines 11. The D register functions principally as a data output latch, and is loaded from the E bus via lines ED. The D register is applied to a DI bus by sixteen parallel lines DDI. The data path from the output 10C of the ALU to the E bus and to the D register via lines ED, then to the DI bus via lines DDI and to the A input of the ALU via the A bus is useful in divide routines, for example. Primarily, however, output data is loaded into the D register from the E bus, then to swap bus S via lines DS, and then to sixteen address/data buffers 12 via lines 13. Data can be transferred onto the swap bus S straight or swapped, depending upon factors like byte operations being performed; these transfers are of course under control of commands on lines 11.

The address/data buffers 12 are sixteen bidirectional, tristate buffers of conventional form, each having an input/output terminal connected to one of the external bus lines 4. These buffers usually receive addresses from the P bus via lines 14, or data via lines 13, for output to the bus 4; for input to the microprocessor chip 1, program or data words are applied via lines 13 to the swap bus S, thence to the K register via lines SK. It is also possible to load the P bus from the K register via lines PK, under a command on a line 11, and thus output the K register via the P bus.

The addresses to memory 2 are usually sent out from the microprocessor 1 via the P bus which is loaded by sixteen lines MAP from the MA register. The bits in this register can also be transferred to the B bus via parallel lines MAB, thus to the B input 10B of the ALU; alternatively the MA register may be loaded from the E bus via lines EMA or from the K latch via lines KMA, all as defined by control lines 11.

Another internal register transparent to a user is the temporary or T register. This register receives a 16-bit parallel output 10F from the ALU 10, and applies its output to the B bus in three ways: either directly via lines TB, shifted left via path TLB or shifted right via path TRB. The T register can also receive the B input 10B to the ALU delayed by $\frac{1}{4}$ of a clock cycle by a path BT. The T register provides an important function in multiply and divide operation as will be explained.

A register also used in multiply and divide operations is referred to as the MQ shift register (for multiply/quotient). This register has the capability of right shift or left shift by commands on lines 11. The register may be loaded from the A bus or the DI bus by 16-bit parallel lines AMQ and DIMQ, or may be outputted to the E bus or the B bus via lines MQE or MQB. For bit or serial CRU operations involving the CRU 7, the "0" bit of the MQ register is loaded from the "0" A/D buffer 12 at a line CMQ; the output for this purpose is by way of the D register, in parallel, even though only one bit may be used.

As instruction register IR provides the usual function of containing the current instruction, the instruction being executed during a given microcode state time (machine cycle). The instruction register IR is loaded from the DI bus via lines DIIR, or may be loaded into the E bus via lines IRE, under control of lines 11. Various fields of the instruction going to IR also can go to A bus by 2-bit and 4-bit connections IR2 and IR4. During each cycle, however, the contents of the instruction register IR are transferred via sixteen parallel lines IR-0–IR15 to entry point and microcontrol generator circuits as well as miscellaneous control circuitry.

The control signals 11 are generated in a control ROM 15 which is in this case split into two halves, 15H for the high side and 15L for the low side of the ALU and registers. Since there are many controls 11 used on only part of the bits, high or low, rather than all sixteen, space is saved by splitting the control ROM 15 in this manner. Each half of the control ROM has an X array 15X and a Y-select array 15Y. Buffers 15B for each line 11 receive the select outputs from the Y array 15Y and introduce clock or other logic as may be needed to produce the controls in the lines 11. The number of microcontrol lines 11 is about 142, depending upon the instruction set (Table D) to be implemented, well within the addressing range (256) of an 8-bit address on lines 16 that go to both sides 15H and 15H. This 8-bit control ROM address is generated by entry point logic or by a microjump circuit. Microjump addresses, produced on eight lines 17 which receive outputs 11 from the control ROM, can generate a jump address for the next state. The microjump address on lines 17 is fed back to a logic array 18 that can also generate an entry point from inputs received from an execute entry point array 19E or a source/destination address entry point array 19A. A group detect circuit 20 receives the 16-bit instruction word from IR as well as status bits from ST and other controls and produces two inputs to the entry point arrays 19A and 19E, first a group identification and second a field. The group is determined by the left-most 1 of the opcode as seen in FIG. 2c, and the field is three or four bits starting with the left-most 1. The address to the control ROM 15 on the lines 16 may also be held in an 8-bit latch 21 so the same state is re-executed as in multiply or divide instructions; to this end a 4-bit state counter SC is provided which counts state-times up to sixteen, and an overflow output of the state counter can control release of the holding latch 21. Thus, operation of the processor is controlled by instructions loaded into the IR register to generate an entry point via group detect 20 and logic arrays 18, 19A, 19E; the entry point is a starting address for the control ROM 15 entered on address lines 16. This address results in a specific set of commands on the control lines 11; some lines 11 will be active and most not. The address may also produce a jump address on lines 17 to define the control ROM address for the next state, or the next state may be another entry point, or may be the same state due to the holding latch 21. When the last state needed for the instruction is reached, the next instruction is loaded into register IR and another entry point derived.

The control outputs 11 from the control ROM 15 also produce bus status codes for lines 6 by a generator circuit 22. The bus status codes of Table E are each generated in response to the specified conditions; an external device can by decoding BST1–BST3 on the lines 6 and MEM- on one of the lines 5 determine exactly what activity is presently being implemented on the bus 4.

Figure 2E:
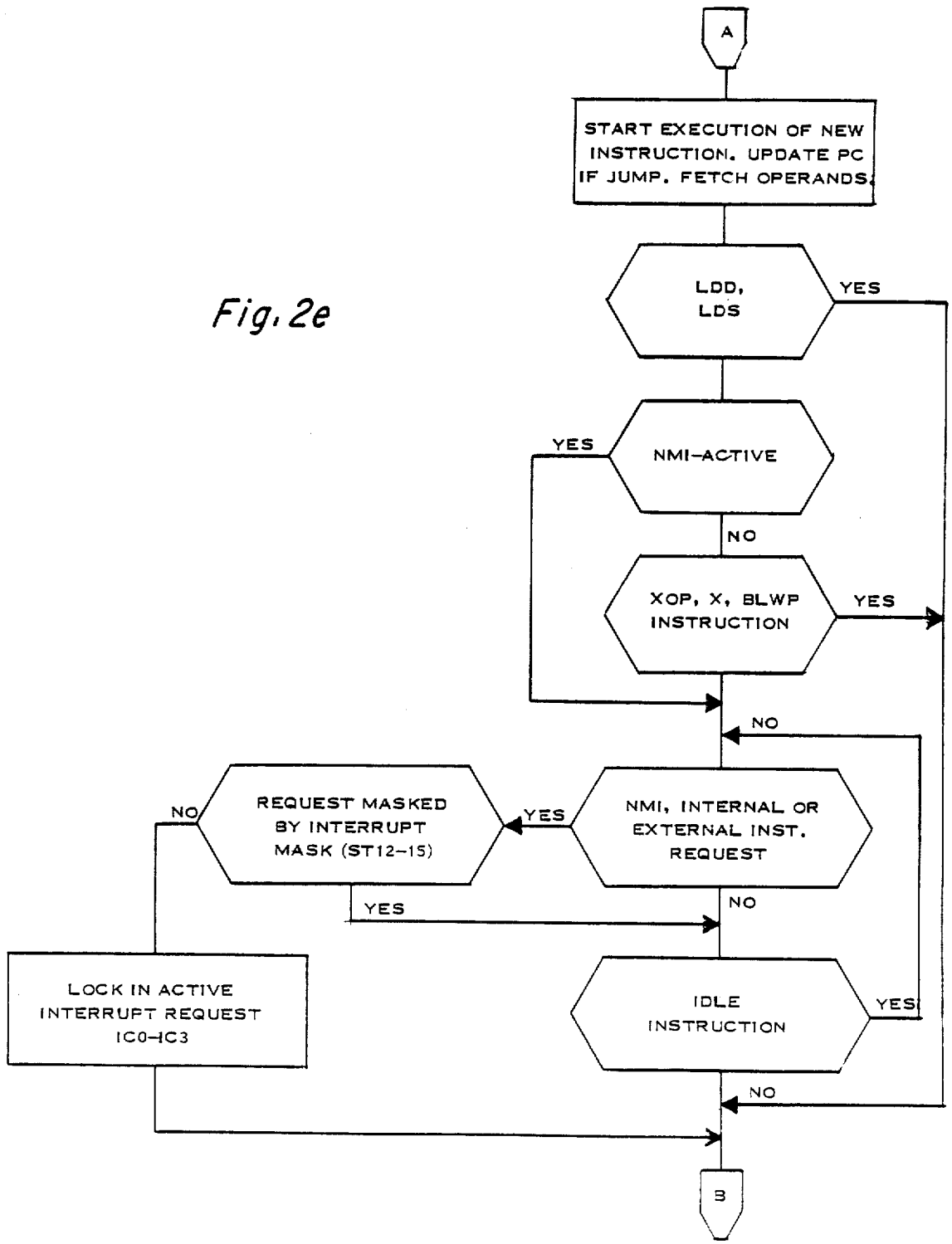
FIG. 2e (four sheets) is a logic flow chart of the execution of instructions and handling of interrupts of the microprocessor device of FIG. 1.
Figure 2H:
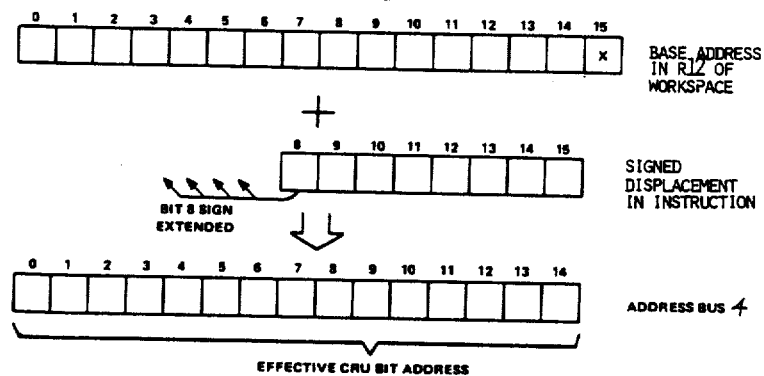
FIG. 2c (three sheets) is a map of the opcodes for the instructions executed by the microprocessor in the system of FIG. 1.
Figure 2I:
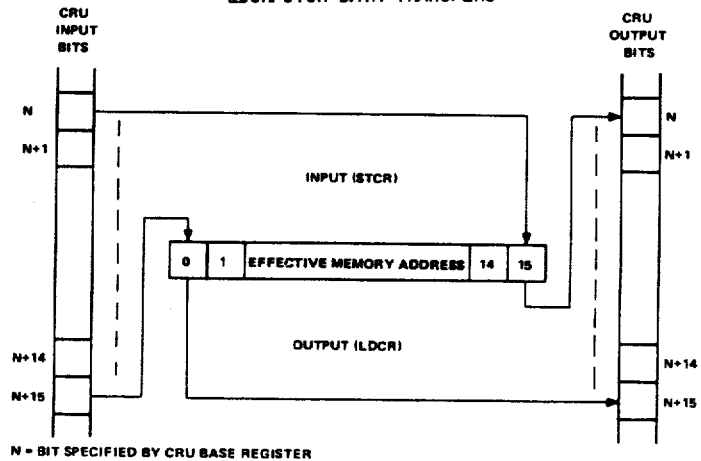

The interrupt codes on the lines 8 and the controls 9 are applied to interrupt control circuitry 23 within the chip 1. Bits 12–15 from the status register ST are also applied to the circuitry 23 to provide the interrupt mask for comparison with an interrupt code from external logic. A logic flow chart defining now interrupts are handled by the processor 1 is shown in FIG. 2e, (four sheets).

The external control lines 5 are connected to control generator circuitry 24 which responds to lines 11 from the control ROM as well as to other conditions within the chip, and to the lines 5, to produce the necessary internal controls and other external controls 5.

An on-chip memory array 25 is included on the processor chip 1 to provide added functions not in the instruction set of Table D. This memory 25 contains a section 25A of ROM, for example 512 words, and a section 25B of RAM, for example sixteen words or one workspace. The ROM 25A resides at hex addresses 0800-0BFE and the RAM 25B at hex addresses 0000-001E, but these are not within the memory map of FIG. 2b; these locations are merely examples. A memory address decode circuit 25C receives a memory address on lines 25D from the P bus and selects one word from the ROM or RAM 25A, 25B, which is input or output via data I/O circuit 25E to lines 13 on sixteen parallel lines 25F. An on-chip memory control 25G detects a specified opcode referred to as MID or macroinstruction detect (in this example either an illegal opcode or an XOP executed while bit-11 of status register ST is set to one; the control 25G is activated to transfer exectuion to the on-chip mmemory 25. When entering this operation, a context switch saves the WP, PC and ST register contents in registers R13, R14 and R15 of the 16-word workspace in RAM 25B. The CPU then executes assembly language instructions (Table D) from the ROM 25A; during execution of these macroinstructions various microinstructions may access the external memory 2 in the usual manner using indirect, indirect autoincrement and indexed addressing modes. By providing this on-chip memory space 25 separate from the external user space (memory map of FIG. 2b), new instructions can be emulated in a manner completely transparent to the programmer. These new instructions are constructed using the Table D set plus special instructions; a customer for the processor chip 1 may specify certain added instructions to be implemented via on-chip memory 25, yet the customer can write the programs to be stored in ROM 25A to execute these instructions using the Table D instruction set. Detailed operation of the memory 25 is explained below.

Execution From On-Chip Memory

The auxiliary on-chip memory 25 provides a method for adding new functions not in Table D and enhancing the performance of specific kernels of software, thereby increasing the total capabilities of the system of FIG. 1. The memory space 25 is separate from the user space 2 or FIG. 2b and is contained within the microprocessor chip 1. Assembly language program segments located in this space 25 benefit from the full performance capabilities of the processor 1 since no wait states are required for memory accesses. While executing in the on-chip memory 25, certain control capabilities are available which are not accessible by ordinary programs. The auxiliary on-chip memory 25 permits a new instruction to be emulated in a manner completely transparent to the programmer.

The memory 25 consists of 512 16-bit words in ROM 25A and 16 words in RAM 25B. The ROM resides at addresses (in hexadecimal) 0800–0BFE, and the RAM resides at addresses 0000–001E, serving as workspace storage during execution in memory 25.

Whenever the processor 1 encounters an MID opcode (an illegal opcode or an XOP executed while status bit-11 is set to 1), a check is made to determine whether an attached processor is prepared to respond to the MID opcode. If not, program control is transferred to the memory 25.

The memory 25 is entered via an entry point table occupying the first ten words of the ROM 25A. Each entry in the table contains the start address in ROM 25A of an emulation routine for a particular MID opcode or group of opcodes. Illegal single-word opcodes are divided into eight groups, with the entry addresses for each group as indicated in Table F. Illegal two-word opcodes are treated as a ninth group, and XOPs as a tenth, as shown in Table F. When an illegal opcode or XOP is encountered, instruction execution transfers to the ROM 25A address in the entry-point table corresponding to that opcode.

A context switch occurs after the entry-point address has been read from the table. The workspace pointer is set to 0000 and the program counter is set to the entry-point address. The old WP, PC, and ST are placed in the RAM 25B at locations in the workspace corresponding to R13, R14 and R15, respectively. The PC value saved in R15 points to the word following the MID opcode. IF the MID opcode is a multiple-word instruction, the saved PC points to the location following the first word of the instruction.

To exit the memory 25, a context switch is invoked by executing a RTWP instruction (opcode 0380 in hex). Interrupts are checked prior to executing the next instruction. In those instances where interrupts (maskable or non-maskable), should not be checked before executing the next instruction, the exit from the memory 25 is invoked using the opcode 0381, a special form of the RTWP instruction. In either case, the WP, PC, and ST registers are updated with R13, R14 and R15 from the RAM 25B. If the memory 25 is entered upon detection of an MID opcode not supported by the memory 25, a level-2 trap must be executed to indicate that an attempt has been made to execute an undefined opcode. The opcode 0382 is provided to exit the memory 25 under these conditions. When this opcode is executed in memory 25, a RTWP occurs followed by a level-2 trap. The opcodes 0380, 0381 and 0382 (hex) provide the only valid means for performing an exit for memory 25.

During emulation of an MID opcode in memory 25, the emulation routine can modify the saved status register in R15 in accordance with the results of the emulated opcode. Upon return from the memory 25, the updated status is passed to the main instruction stream. If the status is not updated, it will be restored in its original form.

During execution in the memory 25, several processor functions are modified to provide increased control. These are interrupts, external memory accessing, an evaluate address instruction EVAD, and conditional jump, as will now be described.

All interrupts except reset are inhibited while executing from memory 25. However, pending interrupts can be detected using the conditional jumps described below.

During execution from memory 25, data in external (offchip) memory 2 is accessed using the indirect, indirect autoincrement and indexed adressing modes. Workspace registers R2, R6, R7, R8, R9, R10, R13 and R14 in the RAM 25B are used as base registers during external accesses. An external access using one of these registers is accompanied by a bus status code indicating a particular type of memory cycle, and MEM- is active low. The bus status code corresponding to the use of each register is indicated in Table G. An external access should utilize a base register whose use is accompanied by a bus status code appropriate to the type of access being performed; the programmer selects a register from Table G accordingly.

Two examples illustrate use of the external access capability. First, R13 in the RAM 25B contains the user's workspace pointer. To read into register R1 in the workspace of RAM 25B the contents of register R4 in the workspace in memory 2 from the main instruction stream executing just prior to entering memory 25 (i.e. the "user's" workspace), the instruction

MOV @8(R13),R1 is executed from memory 25. This instruction says move the contents of the location of address at R13 plus 2×4=8 into R1. A WS bus status code is output during this operation (MEM-=0, BST=110). Second, to read immediate data or a symbolic address (following an MID opcode in the user's program) into R4 in RAM 25B, the instruction

MOV *R14+,R1 is executed while in memory 25. This causes the user's PC in R14 in RAM 25B to be incremented by two, and an IOP bus status code is output (MEM-=0, BST=010).

Using register R0, R1, R3, R4, R5, R11 and R15 as base register for indirect, indirect autoincrement or indexed addressing results in an internal access in the memory 25. During internal accesses, the MEM-, WE- and DEN- signals output from the processor 1 remain inactive high. During execution from memory 25, a NOP bus status code is output during each machine cycle except when an external access is in progress, as explained above.

An EVAD (evaluate address) instruction is provided during execution from memory 25 to permit convenient calculation of effective source and destination addresses for MID opcodes. EVAD assumes that the MID opcode contains a four-bit opcode, a six bit source field and a six-bit destination field. The address calculations are based upon the original WP of the user, saved in R13 in RAM 25B. If the contents of a register in the user's workspace are fetched as part of the address calculation, a WS bus status code is output by the processor 1 while the external access takes place. The saved PC (in R14 of RAM 25B) is incremented appropriately if symbolic or indexed addressing is used. The contents of any workspace register in RAM 25B except R0 can be evaluated using EVAD. When EVAD is executed, the calculated effective source address is placed in R8 in RAM 25B, and the calculated destination address in R7. If the source or destination field specifies autoincrement mode, the address of the user's register is placed in R9 and R10, respectively. A summary of the EVAD instruction, including its effect on status bits 0 and 2, is given at the end of Table D.

For EVAD instructions, if only the source field of an MID opcode is to be evaluated, the destination field should be cleared to prevent unnecessary external accesses or unintentional modification of the user's PC. For example, if the MID opcode resides in R5 in RAM 25B, the instruction sequence

```
ANDI R5, 003F
EVAD R5
``` is executed while in the memory 25 to calculate the effective source address. The destination field, which is all zeros, is interpreted as register direct addressing mode (and ST2 is cleared).

The TB (test bit), SBO (set bit to one) and SBZ (set bit to zero) instructions are not available during execution from memory 25. In place of these operations and using the same opcodes are conditional jump instructions used to detect pending interrupts. These instructions, described at the end of Table D, allow interrupts to be tested at interruptible points in routines executed from memory 25. Instructions requiring long execution times, such as block move instructions for a minicomputer, can be emulated in a way that permits them to be interrupted and resumed after interrupt servicing One restriction exists regarding the use of MID opcodes within interrupt service routines. An MID opcode encountered in the interrupt routine for an NMI or level-1 interrupt, or for a reset routine that does not cause complete system reinitialization, must not result in an exit from the memory 25 by means of opcode 0382, the special form of RTWP that causes a level-2 trap. The reason is that the level-2 routine can be interrupted by an NMI, by a level-1 interrupt or by reset, possibly destroying the return linkage established previously. In general, this restriction can be interpreted to mean that an MID opcode in the service routine of an interrupt of higher priority than level-2 must either be recognized by an extended instruction set processor or defined by an emulation routine in the memory 25.

The last sixteen words of the ROM 25A may be reserved for self-test software used to verify ROM 25A and RAM 25B operation. MID opcode 002D, defined to be the opcode for an execute micro-diagnostics instruction in a minicomputer, is executed in the user program to invoke the self-test routine. Upon encountering this opcode, the processor 1 transfers control to the ROM 25A location (start address of the test routine) pointed to by the address contained in entry-point table location 0804, in the manner indicated in Table F.

Emulation of the On-Chip Memory

In order to allow emulation of the processor 1 with an on-chip memory 25, the processor may be constructed to access an off-chip memory as if it were the ROM memory 25A. This is important for systems development or prototyping purposes. The "software" or firmware written for the ROM 25A must be checked out and de-bugged before the masks are made to produce the chips 1 in volume for a specific customer application.

To this end, the control circuitry 24 responds to a special indication in the form of pulling RESET- and XIPP-low and releasing them simultaneously. This is accomplished by wiring the two together at the external pins. Referring to FIG. 1a, when this emulator mode is thus entered, the ROM 25A is no longer used, and addresses 088–OBFE access an external memory 25A' (but not within the memory map 2b). The on-chip RAM 25B is still active and is used, so addresses 0000–001E are responsed to in the usual manner by the memory 25. In this mode, accesses to the ROM 25A are instead directed to the memory 25A' off-chip, and this memory 25A' may be either ROM, EPROM or RAM. These accesses are accompanied by active WE- and DEN- signals on the lines 5, along with a NOP or 001 code on the BST lines 6. When operating in this mode, the memory 2 is connected to receive the BST lines 6 so that it will not respond when the bus status code is NOP, which distinguishes memory 25 accesses from accesses of the user memory 2 address space of FIG. 2b.

This emulator mode has other advantages in addition to systems development. Parts manufactured with unusable codes in the ROM 25A, or non-functional ROM 25A, need not be discarded, but instead cn be used as emulator devices. Also, small volume custom applications may use the processor 1 exclusively in the emulator mode, with all the accesses to memory 25A going to the off-chip memory 25A' instead. As production volume for such an application rises, the firmware can then be moved on-chip to reduce the system parts count. This has advantages for applications where the initial cost of the completely-custom internal firmware for the on-chip ROM 25A is not justified.

Extended (Off-Chip) Accesses for On-Chip Memory

As described above, all accesses to the memory 25 in the normal mode are accompanied by a NOP bus status code on lines 6 to indicate that an internal cycle is in progress. The address to the memory 25 are actually output via buffers 12 and bus 4, and data from the memory 25 is likewise output. This is only to facilitate debugging the testing because the memory 2 does not respond since the WE- and DEN- outputs on lines 5 from control circuitry 24 are inactive. A useful alternative is to permit accesses to additional off-chip auxiliary memory to expand the memory 25, still separate from the memory map of FIG. 2b.

To this end, accesses to memory 25 space not within the defined addresses 0800 to OBFE and 0000–001E is responsed to in a special way. When in the MID mode, i.e. accessing memory 25 as described above, an address outside the range of memory 25 will cause the control circuitry 24 to activate WE- and DEN- outputs on the lines 5; NOP (and MEM- high) still appears on the BST lines 6. When this occurs, a memory 2' is accessed as indicated in FIG. 1a. The system memory 2 is connected to the BST lines 6 so it will not respond when NOP is involved.

This mode of operation has advantages in adding to the flexibility of the system. The memory 25, off-chip or on-chip, is entirely separate from the user memory space, so complex system functions (added instruction set) are implemented while leaving the user (programmer's) address space intact for simplicity. Speed-critical functions otherwise built up in software can be implemented in extended memory 2' for increased efficiency. Part or all of the off-chip memory 2' can be fast RAM, which will execute faster than if ROM were used because no wait states are needed; the RAM can be used for scratch storage, or loaded upon command with updated emulation software. Of course, the extend off-chip memory 2' for memory 25 provides room for more functions than can fit on the on-chip memory alone, so more complex systems can make use of the processor 1. Indeed, attached-processor type functions can be implemented using the extended memory 2', needed nothing other than memory components and software written in standard assembly language. As with the on-chip memory 25, the off-chip extention 2' of the memory 25 is completely transparent to the user-programmer (all the software is generated in the systems design), and resides in address space entirely separate from the user memory 2.

Macro Instruction Detection (MID) Trap

The acquisition and attempted execution of a macro-instruction opcode will cause the MID trap to occur before execution of the next instruction. Macro-instruction opcodes which cause the trap are listed in Table F of said reference patent. The MID interrupt has basically two applications. The MID opcodes can be considered to be illegal opcodes and the MID trap is then used to detect errors of this nature. The second, and primary application of the MID trap is to allow the definition of additional instructions for the processor, using the on-chip memory 25 or using software in the MID trap service routine to emulate the execution of these instructions. MID opcodes are used as the opcodes for these "macro" instructions. The benefit of this implementation of macro instructions is that the macro instructions can be implemented in the memory 25, in microcode in other processors, or in software by the service routine, and software will then be directly transportable among these processors.

When instruction emulation is performed, the subroutine can modify the saved status register ST in workspace register R15 is accordance with the results of the emulated instruction. The updated status will then be passed to the main instruction stream. Otherwise, unmodified status will be restored by the return.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. A microprocessor system including a single-chip microprocessor device (1) comprising:
  (a) a memory (2) containing a plurality of locations defined by a given set of addresses and containing program instructions and data, the program instructions being of a first type and a second type, said memory being external to said device,
  (b) input/output means (3,7) external to said device for receiving and transmitting information,
  (c) conductor means (4,5,6,8,9) external to said device and coupled to said memory, input/output means and said device,
  (d) said microprocessor device including a central processing unit connected to said memory and said input/output means by said conductor means to couple addresses, program instruction, data and information between the memory, input/output means and central processing unit, said central processing unit comprising:
    an arithmetic logic unit (10) for performing arithmetic and logic operations on data,
    a plurality address/data registers for containing address and data,
    an instruction register (IR) for receiving a predetermined sequence of said program instructions from said memory (2) for execution by the central processing unit, such sequence of program instructions being of a predetermined instruction set,
    control means (15) including decoder means responsive to program instructions of said first type in said instruction register to produce a plurality of controls (11) for defining the operation of said arithmetic logic unit and said address/data registers of the central processing unit, and responsive to program instructions of said second type to generate auxiliary controls,
  (e) an auxiliary storage unit (25A, 25B) containing a plurality of locations defined by a second set of addresses which partially overlaps said given set of addresses, with means (25G, 25D, 25F) initiated by said auxiliary controls from the control means and thereby responsive to a program instruction of said second type for transferring a different sequence of program instructions from such auxiliary storage unit to said instruction register, such different sequence being composed of said program instructions of said first type.

2. A system according to claim 1 wherein said auxiliary storage unit is part of said microprocessor device on a single semiconductor integrated circuit with said central processing unit.

3. A system according to claim 2 wherein said memory is not on said integrated circuit.

4. A system according to claim 2 wherein said auxilliary storage unit and said memory are activated for memory fetch in the alternative.

5. A system according to claim 4 wherein said given set of addresses defines a memory map limited by the logic address space allowed by the number of bits of addresses coupled by said conductor means.

6. A microprocessor system comprising:
  a main memory (2) containing a plurality of locations defined by an address range,
  a central processing unit in a semiconductor unit (1) separate from said main memory (2), said central processing unit including an arithmetic logic unit (10), a plurality of address/data registers, an instruction register (IR) for receiving program instructions for execution by the central processing unit, such program instructions being of a first type and a second type, and control means (15) responsive to a program instruction of said first type in said instruction register to produce a plurality of controls (11) for defining the operation of the arithmetic logic unit and address/data registers in the central processing unit and responsive to a program instruction of said second type in said instruction register to produce an auxiliary control,
  an auxiliary storage unit (25A, 25B) containing a plurality of locations defined by a set of addresses within said address range, wherein said set may overlap addresses of said plurality of locations of said main memory,
  and means (25G,25D,25F) initiated by said auxiliary control from the control means for transferring sequences of program instructions of said first type from such auxiliary storage unit to said instruction register.

7. Apparatus according to claim 6 wherein said auxiliary storage unit is on a single semiconductor integrated circuit with said central processing unit.

8. Apparatus according to claim 7 wherein said main memory is not on said integrated circuit.

9. Apparatus according to claim 4 wherein said auxilliary storage unit includes both ROM and RAM.

10. Apparatus according to claim 8 wherein said main memory and said auxilliary storage unit are activated in the alternative.

11. Apparatus according to claim 8 wherein said address space is the logical address space allowed by the number of bits of addresses of said instructions.

12. A microprocessor system, comprising:
   (a) a single-chip microprocessor device having:
      (i) an arithmetic logic unit for performing arithmetic and logic operations on data applied to inputs thereof to produce a result at an output thereof,
      (ii) a plurality of registers including at least one address register containing a given number of bits to provide a first set of addresses within an address range,
      (iii) an instruction register for receiving program instructions for execution by the microprocessor device, such program instructions being of a first type and a second type,
      (iv) control means coupled to said instruction register and responsive to a program instruction of said first type to produce a plurality of controls for defining operation of the arithmetic logic unit and plurality of registers of the microprocessor device and responsive to a program instruction of said second type to produce an auxiliary control,
      (v) terminals for the device for connection to parts of said system external to said microprocessor device for coupling addresses and data,
      (vi) internal bus means for intercoupling said inputs and output of the arithmetic logic unit, said plurality of registers, said instruction registers, and said terminals,
      (vi) control paths connecting said plurality of controls from said control means to said arithmetic logic unit, said plurality of registers, said instruction register, said terminals, and said internal bus means,
      (viii) an auxiliary storage unit containing a plurality of storage locations accessed by a second set of addresses within said address range, said auxiliary storage unit storing program instructions of said first type,
      (ix) auxiliary addressing means responsive to said auxiliary control from said control means for accessing said auxiliary storage unit using said address register only in response to initiation by a program instruction in said instruction register of said second type to thereby cause execution of program instructions of said first type from said auxiliary storage unit by loading such instructions into said instruction register,
   (b) a memory containing a plurality of locations defined by addresses within said address range and containing program instructions of both first and second type and data, said memory having an address input and a data output,
   (c) external bus means coupling said terminals of said microprocessor device to said address input and data output of said memory.

13. A microprocessor system according to claim 12 wherein said auxiliary storage unit also contains read-/write memory means for storing data.

14. A microprocessor system according to claim 13 wherein said plurality of storage locations of said auxiliary storage unit are read-only memory.

15. A microprocessor system according to claim 12 wherein memory is not accessed at the same time as said auxiliary storage unit is accessed.

16. A microprocessor system according to claim 15 wherein said auxiliary storage unit is not accessed when a program instruction of said first type is in said instruction register for execution.

* * * * *